(12) United States Patent
Zhou et al.

(10) Patent No.: US 11,004,874 B2
(45) Date of Patent: May 11, 2021

(54) THIN FILM TRANSISTOR, METHOD FOR FABRICATING THE SAME, ARRAY SUBSTRATE, AND DISPLAY PANEL

(71) Applicants: Chongqing BOE Optoelectronics Technology Co., Ltd., Chongqing (CN); BOE Technology Group Co., Ltd., Beijing (CN)

(72) Inventors: Hongru Zhou, Beijing (CN); Yongliang Zhao, Beijing (CN); Zhonghao Huang, Beijing (CN); Zhaojun Wang, Beijing (CN); Chao Zhang, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 111 days.

(21) Appl. No.: 16/388,927

(22) Filed: Apr. 19, 2019

(65) Prior Publication Data
US 2020/0105801 A1 Apr. 2, 2020

(30) Foreign Application Priority Data

Sep. 27, 2018 (CN) .......................... 201811132776.3

(51) Int. Cl.
*H01L 27/12* (2006.01)
*H01L 29/66* (2006.01)
*H01L 29/786* (2006.01)

(52) U.S. Cl.
CPC ...... *H01L 27/1244* (2013.01); *H01L 27/1225* (2013.01); *H01L 27/1288* (2013.01); *H01L 29/66969* (2013.01); *H01L 29/7869* (2013.01)

(58) Field of Classification Search
CPC combination set(s) only.
See application file for complete search history.

(56) References Cited

U.S. PATENT DOCUMENTS

2014/0220747 A1* 8/2014 Li .................. H01L 27/124
438/151

* cited by examiner

*Primary Examiner* — Moin M Rahman
(74) *Attorney, Agent, or Firm* — Arent Fox LLP; Michael Fainberg

(57) ABSTRACT

The disclosure discloses a thin film transistor, a method for fabricating the same, an array substrate, and a display panel. The thin film transistor includes: a first conductive layer on a base substrate, a first insulation layer on a side of the first conductive layer facing away from the base substrate, and a second conductive layer on a side of the first insulation layer facing away from the first conductive layer, wherein an active layer is arranged on a side of the first insulation layer facing the first conductive layer, and/or a side thereof facing the second conductive layer.

18 Claims, 19 Drawing Sheets

THIN FILM TRANSISTOR, METHOD FOR FABRICATING THE SAME, ARRAY SUBSTRATE, AND DISPLAY PANEL

CROSS-REFERENCE TO RELATED APPLICATION

This Application claims priority to Chinese Patent Application No. 201811132776.3, filed on Sep. 27, 2018, the content of which is incorporated by reference in the entirety.

FIELD

This disclosure relates to the field of semiconductor technologies, and particularly to a thin film transistor, a method for fabricating the same, an array substrate, and a display panel.

DESCRIPTION OF THE RELATED ART

As the display technologies are advancing, flat display devices have been widely applied to mobile phones, TV sets, computers, and various other consumer electronic products, and become predominant among display devices, due to their high image quality, energy-saving, small thickness, wide application scope, and other advantages. As the display technologies are advancing iteratively and rapidly, LCD displays, OLED displays, etc., are evolving constantly into displays with a larger display size, higher transmittance, low power consumption, a finer image granularity, a curved form, a flexible screen, etc.

A traditional semiconductor thin-film-transistor display device typically includes a gate, a gate insulation layer, a semiconductor layer, a source and drain, a source-drain insulation layer, a pixel electrode, and a common electrode. Respective layers are stacked sequentially over each other in film-forming, exposure, and etching processes. Since the respective layers are arranged in a stack manner, there is such a considerable segment difference that results in low uniformity of thicknesses of the layers, and there may be a defect in an image due to a spot arising from rubbing between the layers coming into contact with each other. In addition, the gate, and the source and drain are arranged as single-layers, a traveling line tends to be broken or short-circuited, thus resulting in a bright dot, a dark dot, a bright line, a dark line, or another defect.

SUMMARY

Embodiments of the disclosure provide a thin film transistor, a method for fabricating the same, an array substrate, and a display panel.

In an aspect, the embodiments of the disclosure provide a thin film transistor including: a first conductive layer on a base substrate; a first insulation layer on a side of the first conductive layer facing away from the base substrate; a second conductive layer on a side of the first insulation layer facing away from the first conductive layer; and an active layer arranged on a side of the first insulation layer facing the first conductive layer, and/or a side of the first insulation layer facing the second conductive layer; wherein the first conductive layer includes: a first gate line extending in a first direction, a first gate connected with the first gate line, a first data line extending in a second direction, a first source connected with the first data line, and a first drain; wherein the second direction is perpendicular to the first direction, and the first data line or the first gate line is arranged with a first broken zone at their intersection; the second conductive layer includes: a second gate line extending in the first direction, a second gate connected with the second gate line, a second data line extending in the second direction, a second source connected with the second data line, and a second drain; wherein the second data line or the second gate line is arranged with a second broken zone at their intersection.

In some embodiments, orthographic projections of the second gate line, the second gate, the second data line, the second source, and the second drain of the second conductive layer onto the base substrate overlap respectively with orthographic projections of the first gate line, the first gate, the first data line, the first source, and the first drain of the first conductive layer onto the base substrate; and the first gate line is connected with the second gate line, the first data line is connected with the second data line, and the first drain is connected with the second drain, through via-holes.

In some embodiments, a second insulation layer is arranged on a side of the second conductive layer facing away from the first insulation layer; and when the first gate line is arranged with the first broken zone, and the second data line is arranged with the second broken zone, a side of the first data line facing away from the first source is provided with first protrusions at two sides of the first broken zone, and the second data line is provided with second protrusions at regions thereof corresponding to the first protrusions; and the first gate line on the two sides of the first broken zone is bridged with the second gate line via a first electrode above the second insulation layer through via-holes, and the second data line on two sides of the second broken zone is bridged with the first protrusions of the first data line through the second protrusions, wherein the second protrusions are bridged with the first protrusions via a second electrode above the second insulation layer through via-holes.

In some embodiments, a second insulation layer is arranged on a side of the second conductive layer facing away from the first insulation layer; and when the first gate line is arranged with the first broken zone, and the second data line is arranged with the second broken zone, a side of the first gate line facing away from the first gate is provided with third protrusions at two sides of the first broken zone, and the second gate line is provided with fourth protrusions at regions thereof corresponding to the third protrusions; and the first gate line on the two sides of the first broken zone is bridged with the fourth protrusions of the second gate line through the third protrusions, wherein the third protrusions are bridged with the fourth protrusions via a third electrode above the second insulation layer through via-holes; and the second data line on two sides of the second broken zone is bridged with the first data line via a fourth electrode above the second insulation layer through via-holes.

In some embodiments, a second insulation layer is arranged on a side of the second conductive layer facing away from the first insulation layer; and when the first data line is arranged with the first broken zone, and the second gate line is arranged with the second broken zone, a side of the first data line facing away from the first source is provided with first protrusions at two sides of the first broken zone, and the second data line is provided with second protrusions at regions thereof corresponding to the first protrusions; and the first gate line on the two sides of the first broken zone is bridged with the second protrusions of the second data line through the first protrusions, wherein the first protrusions are bridged with the second protrusions via a second electrode above the second insulation layer through via-holes; and the second gate line on two sides of the second broken zone is bridged with the first gate line via a first electrode above the second insulation layer through via-holes.

In some embodiments, a second insulation layer is arranged on a side of the second conductive layer facing away from the first insulation layer; and when the first data line is arranged with the first broken zone, and the second gate line is arranged with the second broken zone, a side of the first gate line facing away from the first gate is provided with third protrusions at two sides of the first broken zone, and the second gate line is provided with fourth protrusions at regions thereof corresponding to the third protrusions; and the first data line on the two sides of the first broken zone is bridged with the second data line via a fourth electrode above the second insulation layer through via-holes; and the second gate line on two sides of the second broken zone is bridged with the third protrusions of the first gate line through the fourth protrusions, wherein the fourth protrusions are bridged with the third protrusions via a third electrode above the second insulation layer through via-holes.

In some embodiments, a pixel electrode is arranged on a side of the second insulation layer facing away from the second conductive layer, and the first electrode and the second electrode are arranged at a same layer as the pixel electrode.

In some embodiments, a pixel electrode is arranged on a side of the second insulation layer facing away from the second conductive layer, and the third electrode and the fourth electrode are arranged at a same layer as the pixel electrode.

In some embodiments, the first gate is connected with the second gate through a via-hole, and the first source is connected with the second source through a via-hole.

In some embodiments, a material of the active layer is a metal oxide semiconductor.

In some embodiments, the active layer is arranged on the side of the first insulation layer facing the first conductive layer, and a material of the first conductive layer is a conductive metal oxide or a metal.

In some embodiments, a material of the second conductive layer is same as a material of the first conductive layer.

In another aspect, the embodiments of the disclosure provide an array substrate, including a thin film transistor, wherein thin film transistor includes: a first conductive layer on a base substrate; a first insulation layer on a side of the first conductive layer facing away from the base substrate; a second conductive layer on a side of the first insulation layer facing away from the first conductive layer; and an active layer arranged on a side of the first insulation layer facing the first conductive layer, and/or a side of the first insulation layer facing the second conductive layer; wherein the first conductive layer includes: a first gate line extending in a first direction, a first gate connected with the first gate line, a first data line extending in a second direction, a first source connected with the first data line, and a first drain; wherein the second direction is perpendicular to the first direction, and the first data line or the first gate line is arranged with a first broken zone at their intersection; the second conductive layer includes: a second gate line extending in the first direction, a second gate connected with the second gate line, a second data line extending in the second direction, a second source connected with the second data line, and a second drain; wherein the second data line or the second gate line is arranged with a second broken zone at their intersection.

In some embodiments, orthographic projections of the second gate line, the second gate, the second data line, the second source, and the second drain of the second conductive layer onto the base substrate overlap respectively with orthographic projections of the first gate line, the first gate, the first data line, the first source, and the first drain of the first conductive layer onto the base substrate; and the first gate line is connected with the second gate line, the first data line is connected with the second data line, and the first drain is connected with the second drain, through via-holes.

In some embodiments, a second insulation layer is arranged on a side of the second conductive layer facing away from the first insulation layer; and when the first gate line is arranged with the first broken zone, and the second data line is arranged with the second broken zone, a side of the first data line facing away from the first source is provided with first protrusions at two sides of the first broken zone, and the second data line is provided with second protrusions at regions thereof corresponding to the first protrusions, and the first gate line on the two sides of the first broken zone is bridged with the second gate line via a first electrode above the second insulation layer through via-holes, and the second data line on two sides of the second broken zone is bridged with the first protrusions of the first data line through the second protrusions, wherein the second protrusions are bridged with the first protrusions via a second electrode above the second insulation layer through via-holes; or, a side of the first gate line facing away from the first gate is provided with third protrusions at two sides of the first broken zone, and the second gate line is provided with fourth protrusions at regions thereof corresponding to the third protrusions, and the first gate line on the two sides of the first broken zone is bridged with the fourth protrusions of the second gate line through the third protrusions, wherein the third protrusions are bridged with the fourth protrusions via a third electrode above the second insulation layer through via-holes, and the second data line on two sides of the second broken zone is bridged with the first data line via a fourth electrode above the second insulation layer through via-holes; or, when the first data line is arranged with the first broken zone, and the second gate line is arranged with the second broken zone, a side of the first data line facing away from the first source is provided with first protrusions at two sides of the first broken zone, and the second data line is provided with second protrusions at regions thereof corresponding to the first protrusions, and the first gate line on the two sides of the first broken zone is bridged with the second protrusions of the second data line through the first protrusions, wherein the first protrusions are bridged with the second protrusions via a second electrode above the second insulation layer through via-holes, and the second gate line on two sides of the second broken zone is bridged with the first gate line via a first electrode above the second insulation layer through via-holes; or, a side of the first gate line facing away from the first gate is provided with third protrusions at two sides of the first broken zone, and the second gate line is provided with fourth protrusions at regions thereof corresponding to the third protrusion, and the first data line on the two sides of the first broken zone is bridged with the second data line via a fourth electrode above the second insulation layer through via-holes; and the second gate line on two sides of the second broken zone is bridged with the third protrusions of the first gate line through the fourth protrusions, wherein the fourth protrusions are bridged with the third protrusions via a third electrode above the second insulation layer through via-holes.

In still another aspect, the embodiments of the disclosure provide a display panel, including the array substrate above according to the embodiments of the disclosure.

In yet another aspect, the embodiments of the disclosure provide a method for fabricating the thin film transistor above according to the embodiments of the disclosure, the method including: forming the first conductive layer on the base substrate; forming the first insulation layer on the side of the first conductive layer facing away from the base substrate; and forming the second conductive layer on the side of the first insulation layer facing away from the first conductive layer; wherein the method further includes: before the first insulation layer is formed on the side of the first conductive layer facing away from the base substrate, forming the active layer on a side of the first conductive layer facing away from the base substrate; and/or, before the second conductive layer is formed on the side of the first insulation layer facing away from the first conductive layer, forming the active layer on a side of the first insulation layer facing away from the first conductive layer.

In some embodiments, the method further includes: forming a second insulation layer on a side of the second conductive layer facing away from the first insulation layer; and forming a pixel electrode layer on a side of the second insulation layer facing away from the second conductive layer.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

In order to make the objects, technical solutions, and advantages of the embodiments of the disclosure more apparent, the technical solutions according to the embodiments of the disclosure will be described below clearly and fully with reference to the drawings in the embodiments of the disclosure. Apparently the embodiments to be described are only a part but not all of the embodiments of the disclosure. Based upon the embodiments here of the disclosure, all of other embodiments which can occur to those ordinarily skilled in the art without any inventive effort shall come into the scope of the disclosure as claimed.

Unless defined otherwise, technical terms or scientific terms throughout the disclosure shall convey their usual meaning as appreciated by those ordinarily skilled in the art to which the disclosure pertains. The terms "first", "second", or the like throughout the disclosure do not suggest any order, number or significance, but is only intended to distinguish different components from each other. Alike the terms "include", "comprise", or the like refer to that an element or an item preceding to the term encompasses an element(s) or an item(s) succeeding to the term, and its (or their) equivalence(s), but shall not preclude another element (s) or item(s). The term "connect", "connected", or the like does not suggest physical or mechanical connection, but may include electrical connection no matter whether it is direct or indirect. The terms "above", "below", "left", "right", etc., are only intended to represent a relative positional relationship, and when the absolute position of an object as described is changed, the relative positional relationship may also be changed accordingly.

For the sake of clarity and conciseness of the following description of the embodiments of the disclosure, a detailed description of known functions and components will be omitted in the disclosure.

Figure 1:
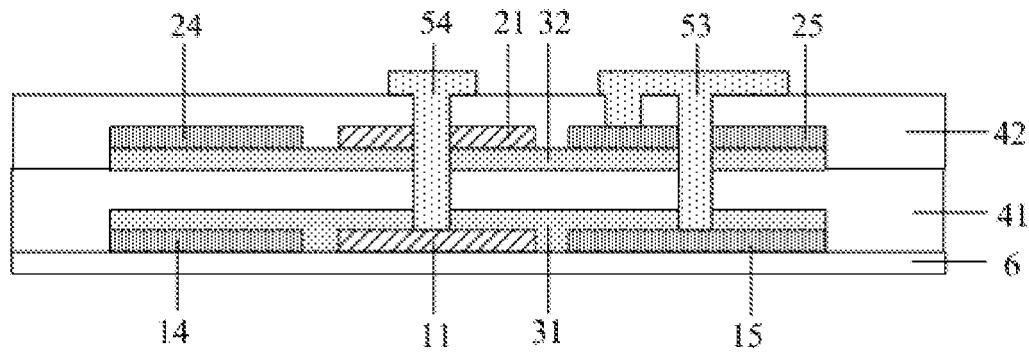
FIG. 1 is a schematic structural diagram of a thin film transistor according to the embodiments of the disclosure in a sectional view.
Figure 2:
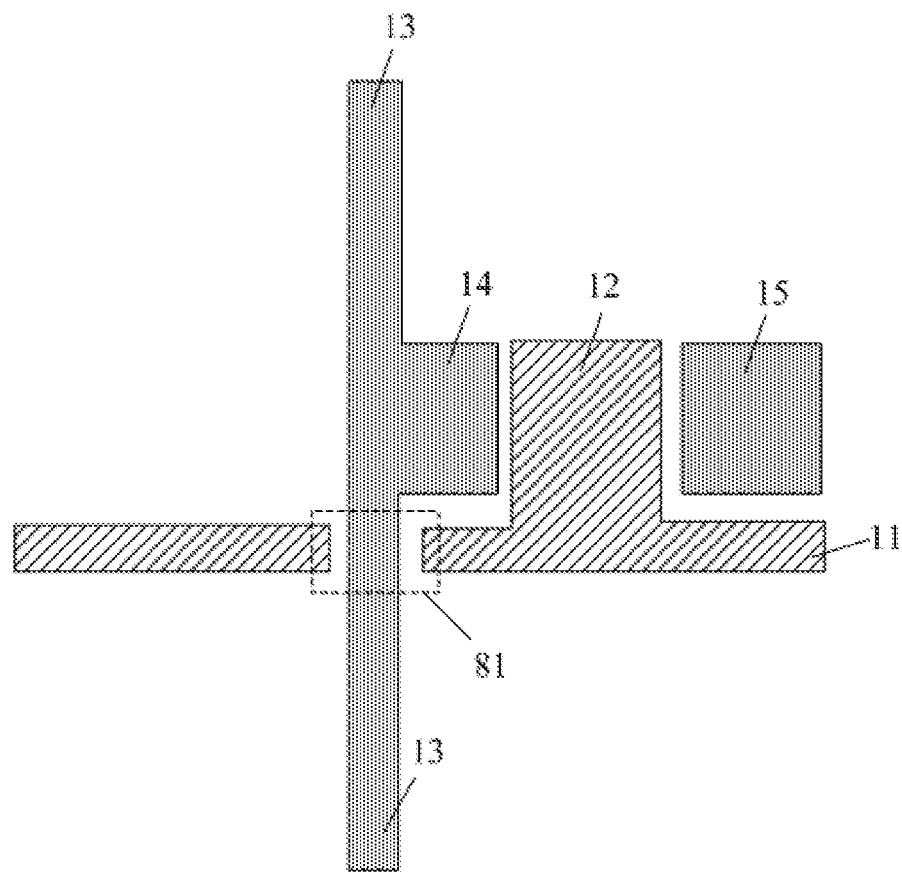
FIG. 2 is a schematic diagram of a first conductive layer according to the embodiments of the disclosure in a top view.
Figure 3:
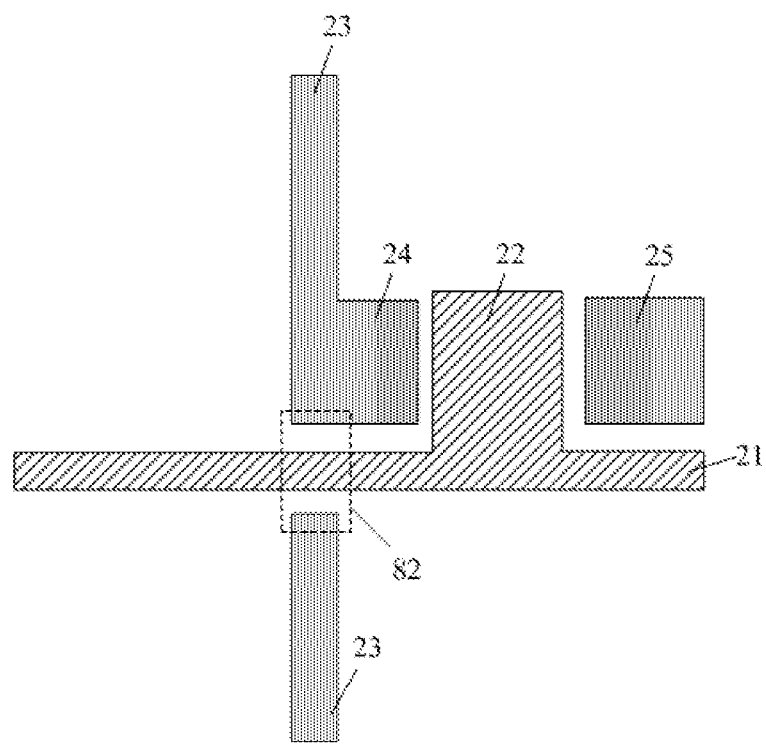
FIG. 3 is a schematic diagram of a second conductive layer according to the embodiments of the disclosure in a top view.

As illustrated in FIG. 1, FIG. 2, and FIG. 3, the embodiments of the disclosure provide a thin film transistor including: a first conductive layer on a base substrate 6, a first insulation layer 41 on a side of the first conductive layer facing away from the base substrate, and a second conductive layer on a side of the first insulation layer 41 facing away from the first conductive layer, where an active layer 31 (32) is arranged on a side of the first insulation layer 41 facing the first conductive layer, and/or a side of the first insulation layer 41 facing the second conductive layer. That is, only an active layer 31 is arranged on the side of the first insulation layer 41 facing the first conductive layer, or only an active layer 32 is arranged on the side of the first insulation layer 41 facing the second conductive layer, or an active layer 31 is arranged on the side of the first insulation layer 41 facing the first conductive layer, and also an active layer 32 is arranged on the side of the first insulation layer 41 facing the second conductive layer, thus resulting in a two-layer active layer, where when the thin film transistor includes the two-layer active layer, each of a gate, a source and drain, and the active layer is arranged in two layers, thus substantially increasing a thickness of the active layer and a thickness of the gate; and the two-layer gate can drive the two-layer active layer concurrently, thus resulting in a thin film transistor in a dual-drive structure to thereby improve the drive capacity of the thin film transistor, reduce a response time, lower drive voltage, and save power consumption.

As illustrated in FIG. 2, the first conductive layer includes: a first gate line 11 extending in a first direction, a first gate 12 connected with the first gate line 11, a first data line 13 extending in a second direction, a first source 14 connected with the first data line 13, and a first drain 15; where the second direction is perpendicular to the first direction, and the first data line 13 or the first gate line 11 is arranged with a first broken zone at their intersection, that is, a first broken zone 81 can be arranged on the first data line 13 at an intersection thereof with the first gate line 11, or a first broken zone 81 can be arranged on the first gate line 11 at an intersection thereof with the first data line 13, and FIG. 2 illustrates a first broken zone 81 arranged on the first gate line 11 at the intersection thereof with the first data line 13 by way of an example.

As illustrated in FIG. 3, the second conductive layer includes: a second gate line 21 extending in the first direction, a second gate 22 connected with the second gate line 21, a second data line 23 extending in the second direction, a second source 24 connected with the second data line 23, and a second drain 25; where a second broken zone 82 is arranged on the second data line 23 at an intersection thereof with the second gate line 21, or on the second gate line 21 at an intersection thereof with the second data line 23, and FIG. 3 illustrates a second broken zone 82 arranged on the second data line 23 at the intersection thereof with the second gate line 21 by way of an example.

In some embodiments, orthographic projections of the second gate line 21, the second gate 22, the second data line 23, the second source 24, and the second drain 25 of the second conductive layer onto the base substrate 6 overlap respectively with orthographic projections of the first gate line 11, the first gate 12, the first data line 13, the first source 14, and the first drain 15 of the first conductive layer onto the base substrate 6, that is, the orthographic projection of the second gate line 21 of the second conductive layer onto the base substrate 6 overlaps with the orthographic projection of the first gate line 11 of the first conductive layer onto the base substrate 6, the orthographic projection of the second gate 22 of the second conductive layer onto the base substrate 6 overlaps with the orthographic projection of the first gate 12 of the first conductive layer onto the base substrate 6, the orthographic projection of the second data line 23 of the second conductive layer onto the base substrate 6 overlaps with the orthographic projection of the first data line 13 of the first conductive layer onto the base substrate 6, the orthographic projection of the second source 24 of the second conductive layer onto the base substrate 6 overlaps with the orthographic projection of the first source 14 of the first conductive layer onto the base substrate 6, and the orthographic projection of the second drain 25 of the second conductive layer onto the base substrate 6 overlaps with the orthographic projection of the first drain 15 of the first conductive layer onto the base substrate 6. In some embodiments, the first gate line 11 is connected with the second gate line 21, the first data line 13 is connected with the second data line 23, and the first drain 15 is connected with the second drain 25, through via-holes. It shall be noted that, since the first source 14 is connected with the first data line 13, the second source 24 is connected with the second data line 23, and the first data line 13 is connected with the second data line 23 through a via-hole, the first source 14 and the second source 24 can be thus connected with each other instead of being connected with each other through a separately arranged via-hole. Of course, in order for a better conduction effect, the first source 14 can alternatively be connected with the second source 24 through a separately arranged via-hole. Further, it shall be appreciated that since the first conductive layer is arranged with the first broken zone, and the second conductive layer is arranged with the second broken zone, the orthographic projections of the respective structures of the second conductive layer other than the second broken zone shall overlap with the corresponding orthographic projections of the respective structures of the first conductive layer other than the first broken zone.

The thin film transistor according to the embodiments of the disclosure includes: a first conductive layer on a base substrate, a first insulation layer on a side of the first conductive layer facing away from the base substrate, and a second conductive layer on a side of the first insulation layer facing away from the first conductive layer, where an active layer is arranged on a side of the first insulation layer facing the first conductive layer, and/or a side of the first insulation layer facing the second conductive layer; and the first conductive layer includes a first gate line extending in a first direction, a first gate connected with the first gate line, a first data line extending in a second direction, a first source connected with the first data line, and a first drain, where the second direction is perpendicular to the first direction, and the first data line or the first gate line is arranged with a first broken zone at their intersection; the second conductive layer includes a second gate line extending in the first direction, a second gate connected with the second gate line, a second data line extending in the second direction, a second source connected with the second data line, and a second drain, where a second broken zone is arranged on the second data line or on the second gate line at their intersection. That is, in the thin film transistor according to the embodiments of the disclosure, the gate, and the source and drain are arranged at the same layer to thereby effectively improve the uniformity of an array substrate including the thin film transistor, reduce the segment difference, and avoid a spot from arising from rubbing in a cell assembly process, and as compared with the related art in which the gate, and the source and drain are wired at single layers respectively, the gate and the source and drain are wired at the same layer to thereby reserve a larger area and further save a cost without affecting a cover area thereof.

Further, in the thin film transistor according to the embodiments of the disclosure, orthographic projections of the second gate line, the second gate, the second data line, the second source, and the second drain of the second conductive layer onto the base substrate overlap respectively with orthographic projections of the first gate line, the first gate, the first data line, the first source, and the first drain of the first conductive layer onto the base substrate; and the first gate line is connected with the second gate line, the first data line is connected with the second data line, and the first drain is connected with the second drain, through via-holes. That is, when each of the gate, the source and drain, and the active layer is arranged in two layers, the two layers of the active layer are connected, and the two layers of the gate are connected, through the via-holes, so the thickness of the active layer, and the thickness of the gate are substantially increased, and the two-layer gate can drive the two-layer active layer concurrently, thus resulting in a thin film transistor in a dual-drive structure to thereby improve the drive capacity of the thin film transistor, reduce a response time, lower drive voltage, and save power consumption; and further, the different layers of the gate, and the source and drain are connected through the via-holes to thereby shorten a Resistance-Capacitance (RC) delay so as to effectively lower power consumption, and even if some layer of the gate or the source and drain is short-circuited, or there is a bad lapping through some via-hole, then the circuit will not be broken, thus improving the product yield. Additionally, in the thin film transistor according to the embodiments of the disclosure, the two layers of the gate are arranged in a stack manner, which can effectively integrate both the advantages of a top-gate structure and a bottom-gate structure.

In some embodiments, since each conductive layer includes a gate line and a data line, and also since the gate line and the data line extend in different directions, one of them shall be broken at their intersection to thereby avoid cross-connection at the same layer. In some embodiments, both of the two conductive layers can be broken at gate lines, or can be broken at data lines, or one of them can be broken at a data line, and the other can be broken at a gate line; and as compared with the instance in which both of the two conductive layers are broken at the data lines or the gate lines, the risk of a poor contact arising from an abnormal-lapping of a via-hole can be lowered, and power consumption can be avoided from being increased due to an increase in resistance of a via-hole lapping wire, in the instance in which one of the two conductive layers is broken at the data line, and the other is broken at the gate line. The instance in which one of the two conductive layers is broken at the data line, and the other is broken at the gate line will be described below in details by way of an example.

Figure 4:
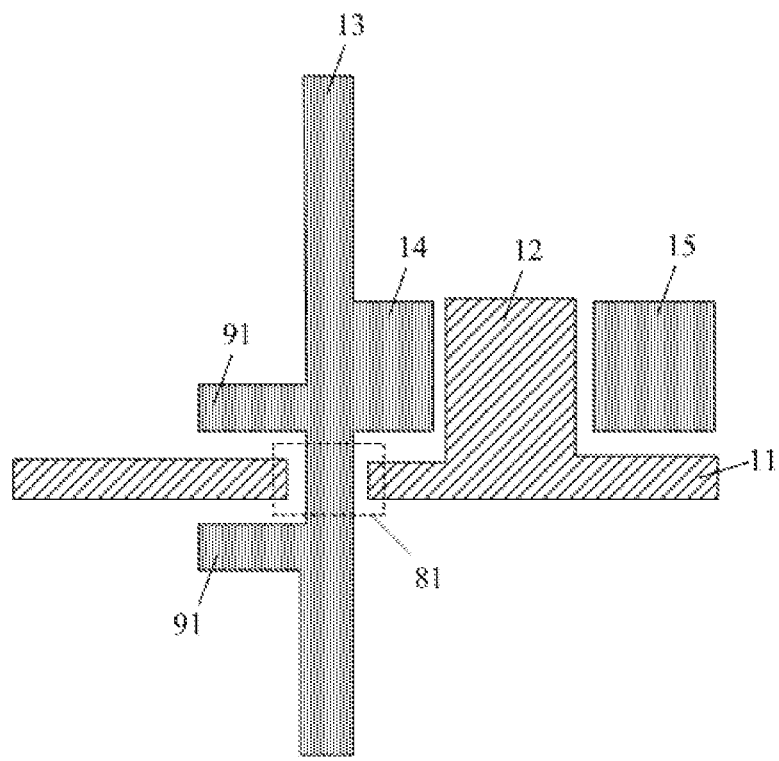
FIG. 4 is a schematic diagram of the embodiments of the disclosure in which a first gate line of a first conductive layer is broken, and a data line is arranged with a protrusion, in a top view.
Figure 5:
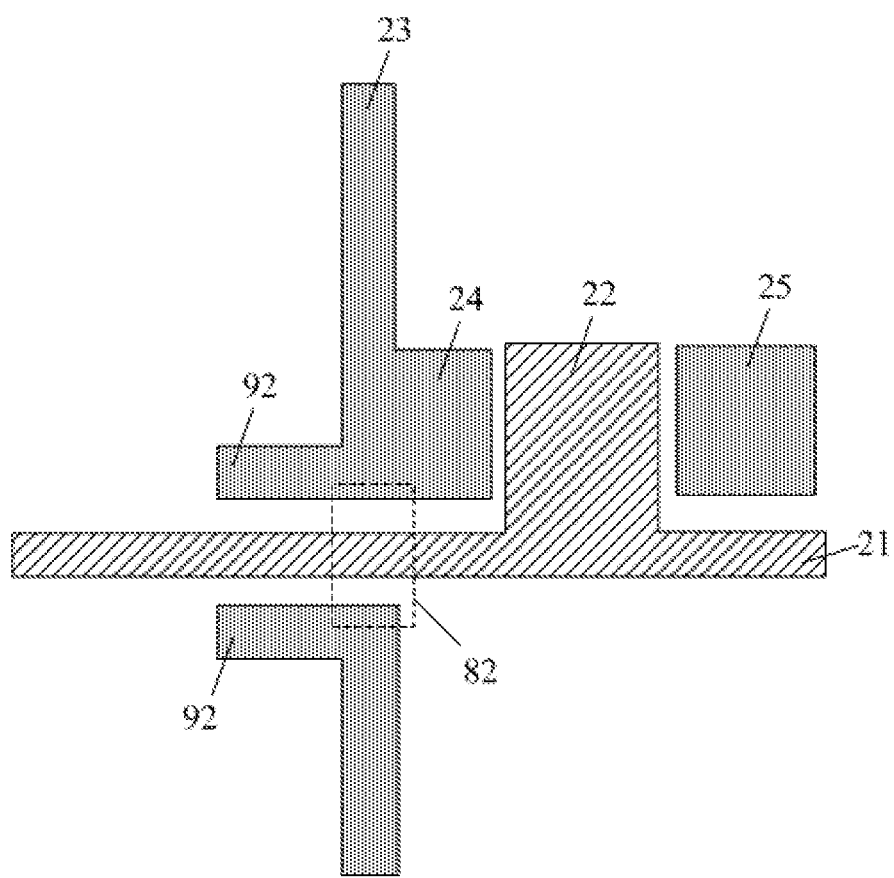
FIG. 5 is a schematic diagram of the embodiments of the disclosure in which a second data line of a second conductive layer is broken, and a data line is arranged with a protrusion, in a top view.
Figure 6:
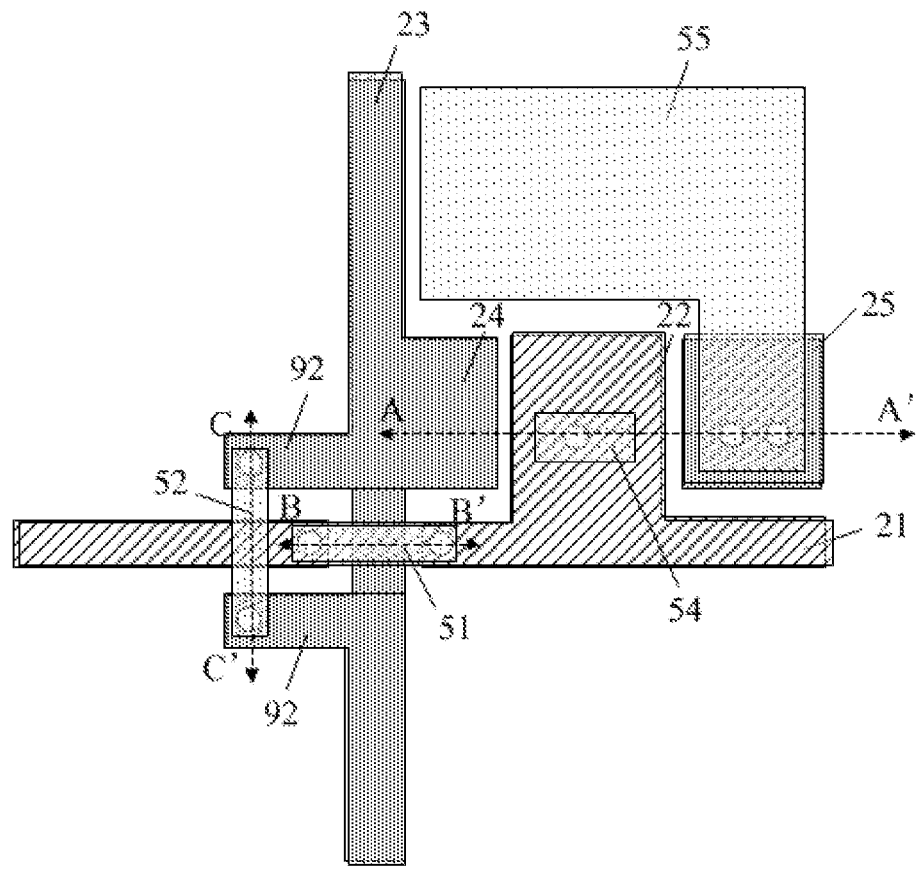
FIG. 6 is a schematic diagram of the embodiments of the disclosure in which two conductive layers are stacked over each other when a first gate line is broken, and a second data line is broken, in a top view.
Figure 7:
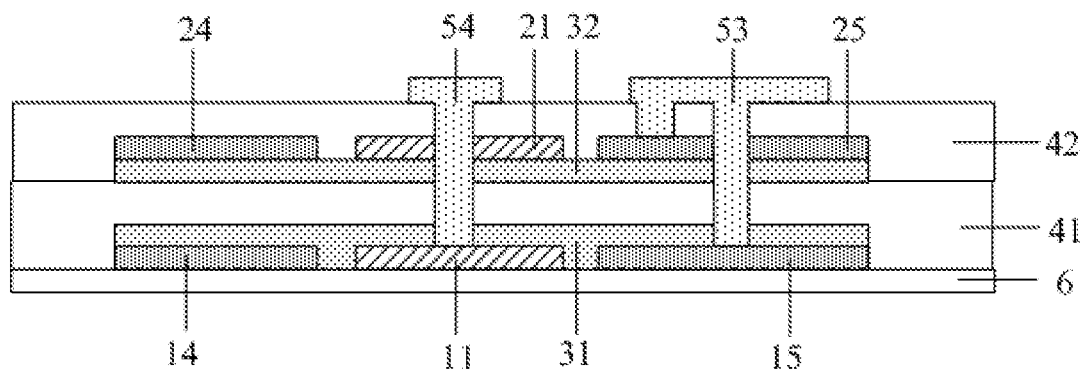
FIG. 7 is a schematic structural diagram of FIG. 6 in a sectional view along A-A'.
Figure 8:
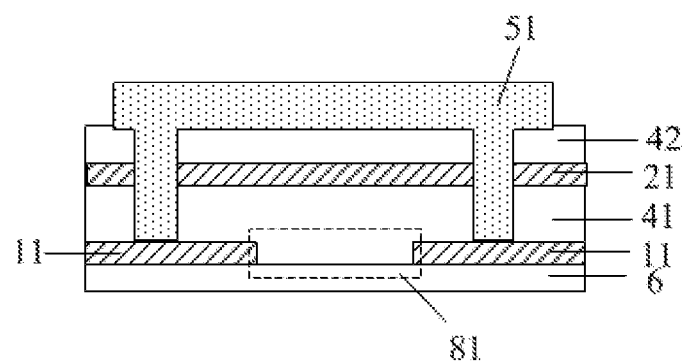
FIG. 8 is a schematic structural diagram of FIG. 6 in a sectional view along B-B'.
Figure 9:
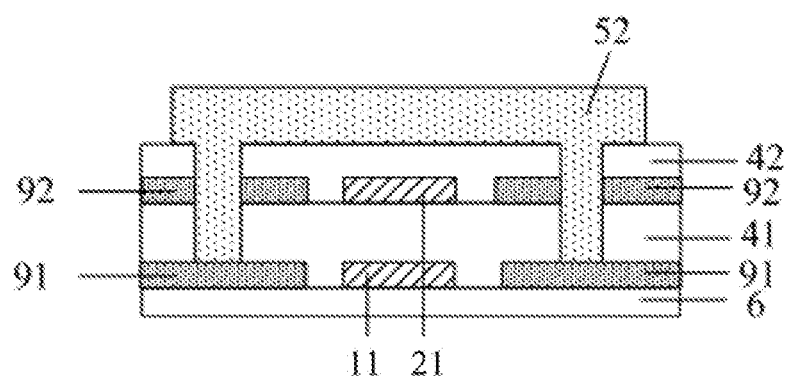
FIG. 9 is a schematic structural diagram of FIG. 6 in a sectional view along C-C'.
Figure 10:
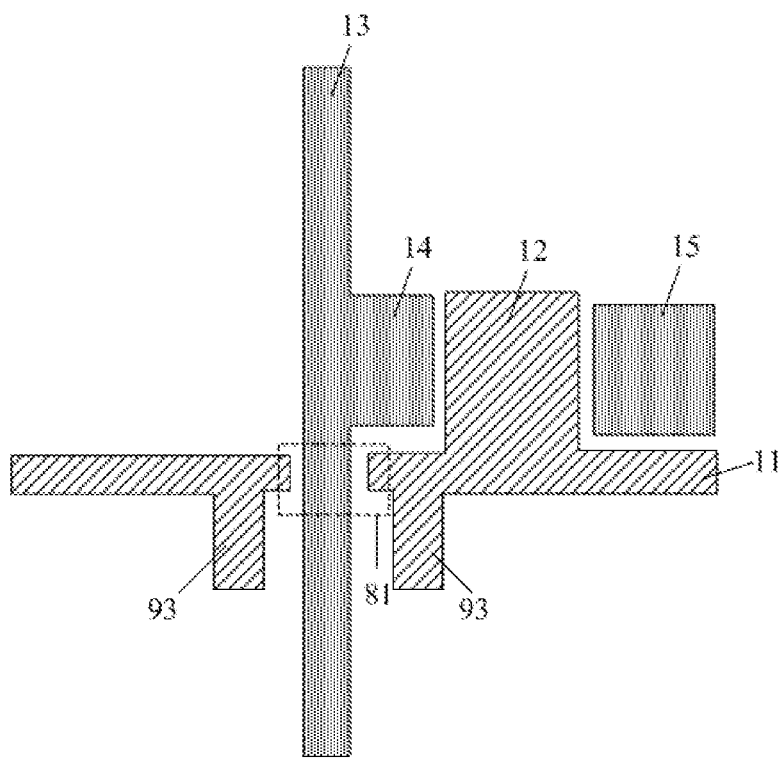
FIG. 10 is a schematic diagram of the embodiments of the disclosure in which a first gate line of a first conductive layer is broken, and gate lines are arranged with protrusions, in a top view.

As illustrated in FIG. 4 to FIG. 9, for example, FIG. 4 illustrates the first conductive layer, FIG. 5 illustrates the second conductive layer, FIG. 6 illustrates a schematic diagram after the first conductive layer and the second conductive layer are stacked over each other in a top view, FIG. 7 is a schematic structural diagram of FIG. 6 in a sectional view along A-A', FIG. 8 is a schematic structural diagram of FIG. 6 in a sectional view along B-B', and FIG. 9 is a schematic structural diagram of FIG. 6 in a sectional view along C-C', where a first broken zone 81 is arranged on the first gate line 11 at the intersection thereof with the first data line 13, a second broken zone 82 is arranged on the second data line 23 at the intersection thereof with the second gate line 21, and a second insulation layer 42 is arranged on a side of the second conductive layer facing away from the first insulation layer 41.

Where, the first data line 13 is provided with first protrusions 91 at two sides of the first broken zone 81, at a side of the first data line 13 facing away from the first source 14; and the second data line 23 is provided with second protrusions 92 at regions thereof corresponding to the first protrusions 91, that is, orthographic projections of the second protrusions 92 onto the base substrate overlap with orthographic projections of the first protrusions 91 onto the base substrate.

As illustrated in FIG. 6 and FIG. 8, the first gate line 11 on both of the two sides of the first broken zone 81 is bridged with the second gate line 21 via a first electrode 51 above the second insulation layer 42 through via-holes, in the sectional view along B-B'; and as illustrated in FIG. 6 and FIG. 9, the second data line 23 on both sides of the second broken zone 82 is bridged, through the second protrusions 92, with the corresponding first protrusions 91 of the first data line 13 via a second electrode 52 above the second insulation layer 42 through via-holes in the sectional view along C-C' as illustrated in FIG. 9. In a practical implementation, a pixel electrode layer is arranged on a side of the second insulation layer 42 facing away from the second conductive layer, a pixel electrode 55 at the pixel electrode layer is connected with the first drain 15 and the second drain 25 through via-holes, and the first electrode 51 and the second electrode 52 are arranged at the same layer as the pixel electrode 55; and in some embodiments, a fifth electrode 54 can be further arranged at the pixel electrode layer to connect the first gate 12 of the first conductive layer with the second gate 22 of the second conductive layer to thereby reduce a response time of the thin film transistor so as to improve the drive performance thereof.

Figure 11:
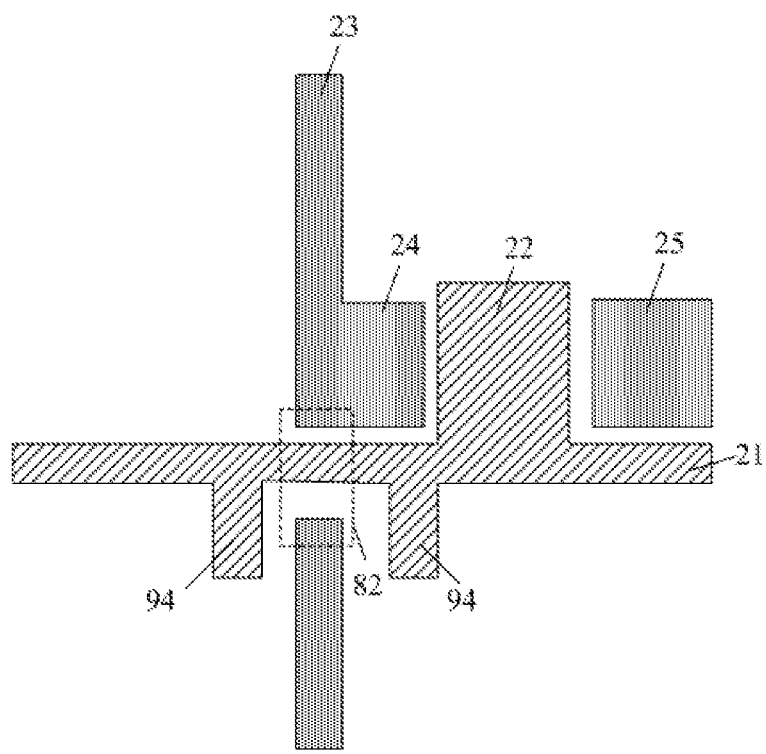
FIG. 11 is a schematic diagram of the embodiments of the disclosure in which a second data line of a second conductive layer is broken, and gate lines are arranged with protrusions, in a top view.
Figure 12:
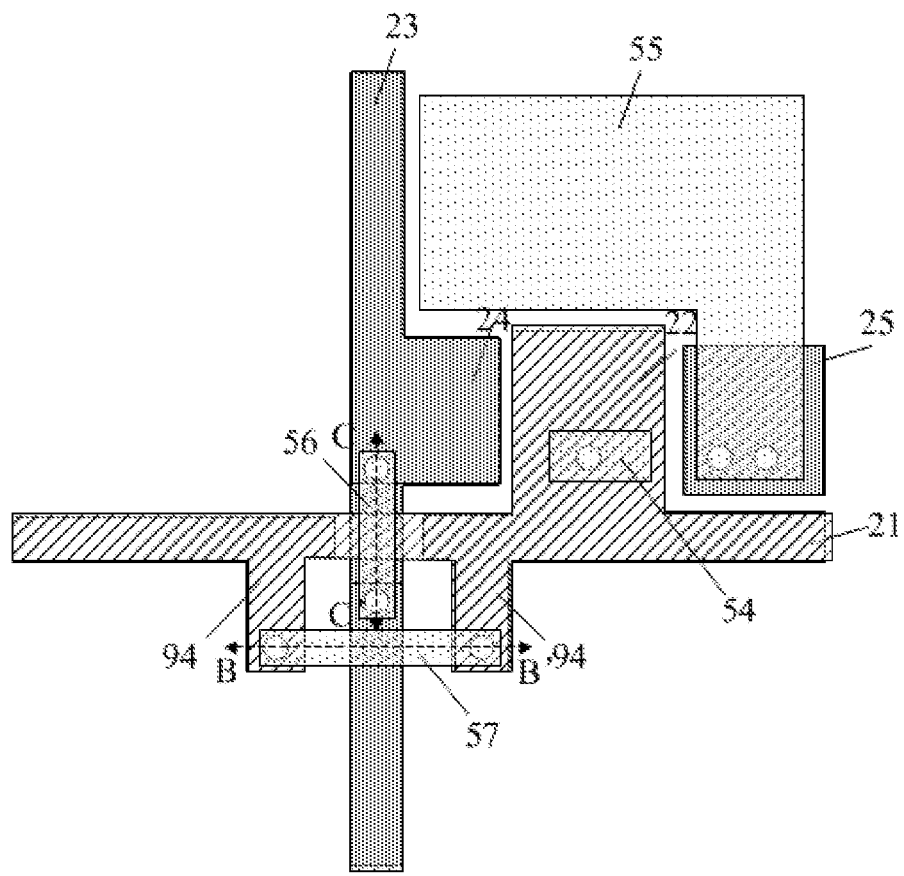
FIG. 12 is a schematic diagram of the embodiments of the disclosure in which two conductive layers are stacked over each other when a first gate line is broken, and a second data line is broken, in a top view.
Figure 13:
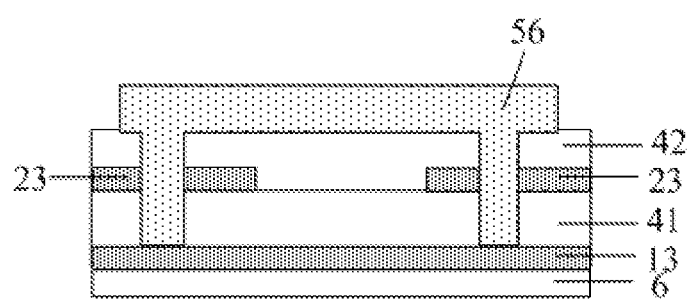
FIG. 13 is a schematic structural diagram of FIG. 12 in a sectional view along C-C'.
Figure 14:
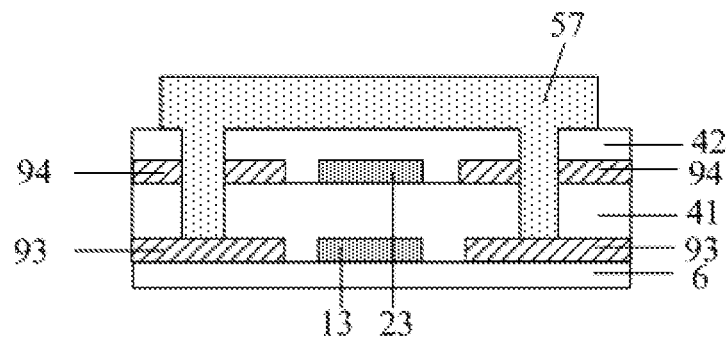
FIG. 14 is a schematic structural diagram of FIG. 12 in a sectional view along B-B'.
Figure 15:
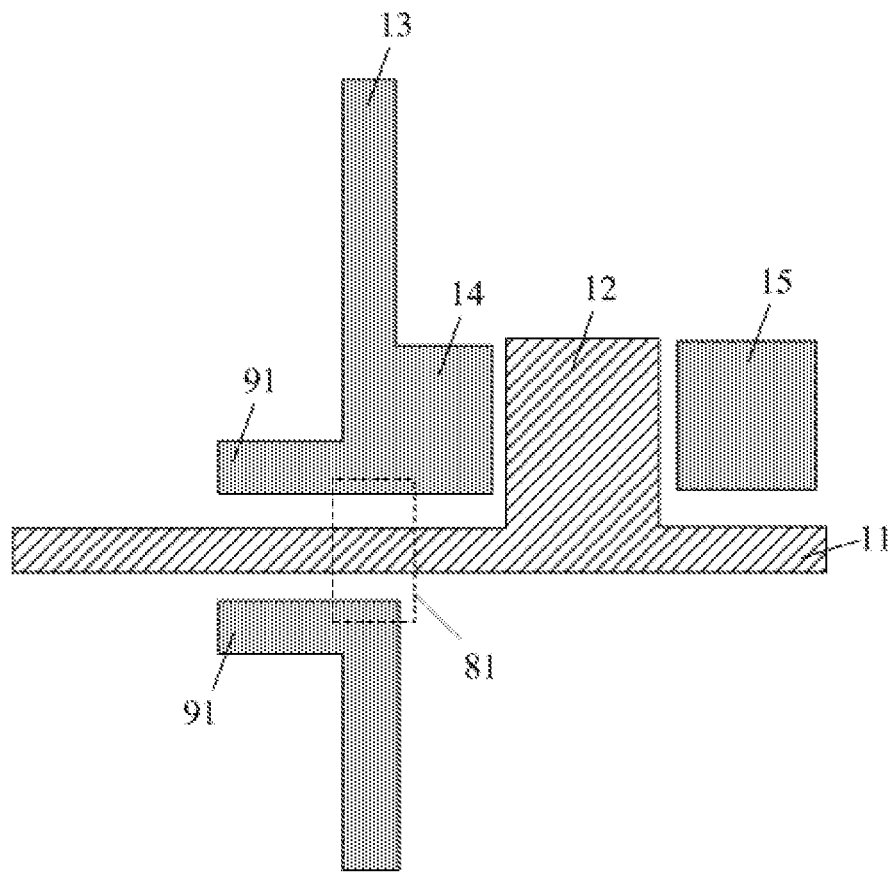
FIG. 15 is a schematic diagram of the embodiments of the disclosure in which a first data line of a first conductive layer is broken, and data lines are arranged with protrusions, in a top view.

In another example, as illustrated in FIG. 10 to FIG. 14, FIG. 10 illustrates the first conductive layer, FIG. 11 illustrates the second conductive layer, FIG. 12 illustrates a schematic diagram after they are stacked over each other in a sectional view, FIG. 13 is a schematic structural diagram of FIG. 12 in a sectional view along C-C', and FIG. 14 is a schematic structural diagram of FIG. 12 in a sectional view along B-B', where a first broken zone 81 is arranged on the first gate line 11 at the intersection thereof with the first data line 13, a second broken zone 82 is arranged on the second data line 23 at the intersection thereof with the second gate line 21, and a second insulation layer 42 is arranged on the second conductive layer.

Where, the first gate line 11 is provided with third protrusions 93 at two sides of the first broken zone 81, at a side of the first gate line 11 facing away from the first gate 12; and the second gate line 21 is provided with fourth protrusions 94 at regions thereof corresponding to the third protrusions 93, that is, orthographic projections of the fourth protrusions 94 onto the base substrate overlap with orthographic projections of the third protrusions 931 onto the base substrate.

As illustrated in FIG. 12 and FIG. 14, the first gate line 11 on both of the two sides of the first broken zone 81 is bridged, through the third protrusions 93, with the fourth protrusions 94 of the second gate line 21 via a third electrode 57 above the second insulation layer 42 through via-holes, in the sectional view along B-B'; and as illustrated in FIG. 12 and FIG. 13, the second data line 23 on both sides of the second broken zone 82 is bridged with the first data line 13 via a fourth electrode 56 above the second insulation layer 42 through via-holes, in the sectional view along C-C'. In a practical implementation, a pixel electrode layer is arranged on a side of the second insulation layer 42 facing away from the second conductive layer, a pixel electrode 55 at the pixel electrode layer is connected with the first drain 15 and the second drain 25 through via-holes, and the third electrode 57 and the fourth electrode 56 are arranged at the same layer as the pixel electrode 55; and in some embodiments, a fifth electrode 54 can be further arranged at the pixel electrode layer to connect the first gate 12 of the first conductive layer with the second gate 22 of the second conductive layer to thereby reduce a response time of the thin film transistor so as to improve the drive performance thereof.

Figure 16:
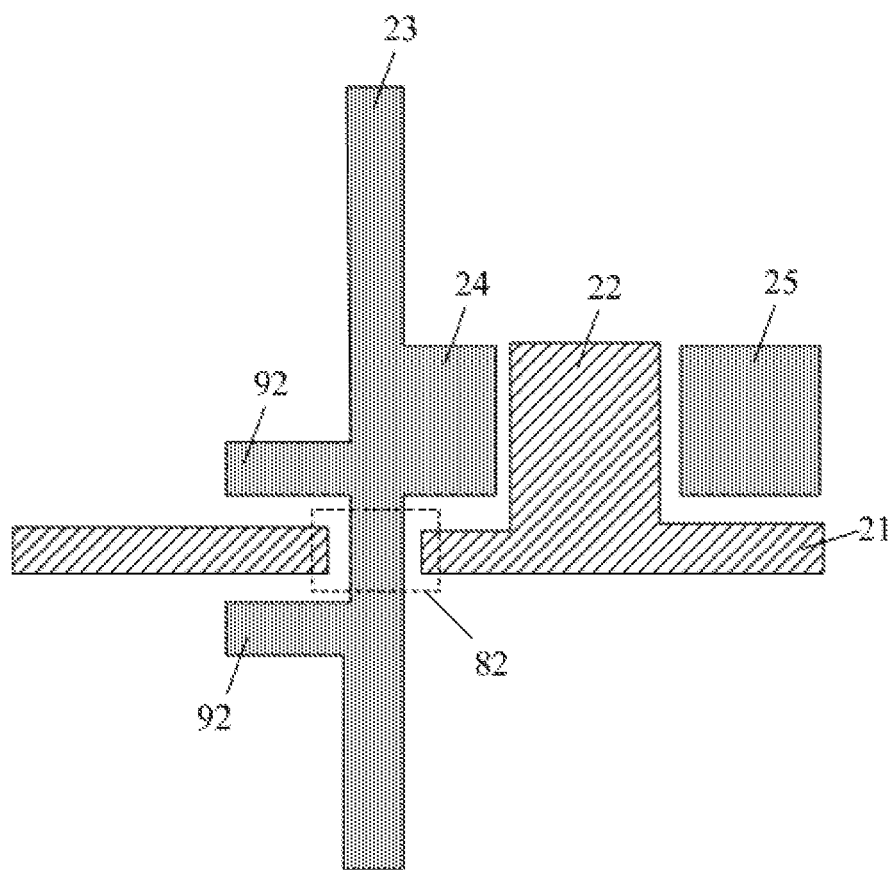
FIG. 16 is a schematic diagram of the embodiments of the disclosure in which a second gate line of a second conductive layer is broken, and data lines are arranged with protrusions, in a top view.
Figure 17:
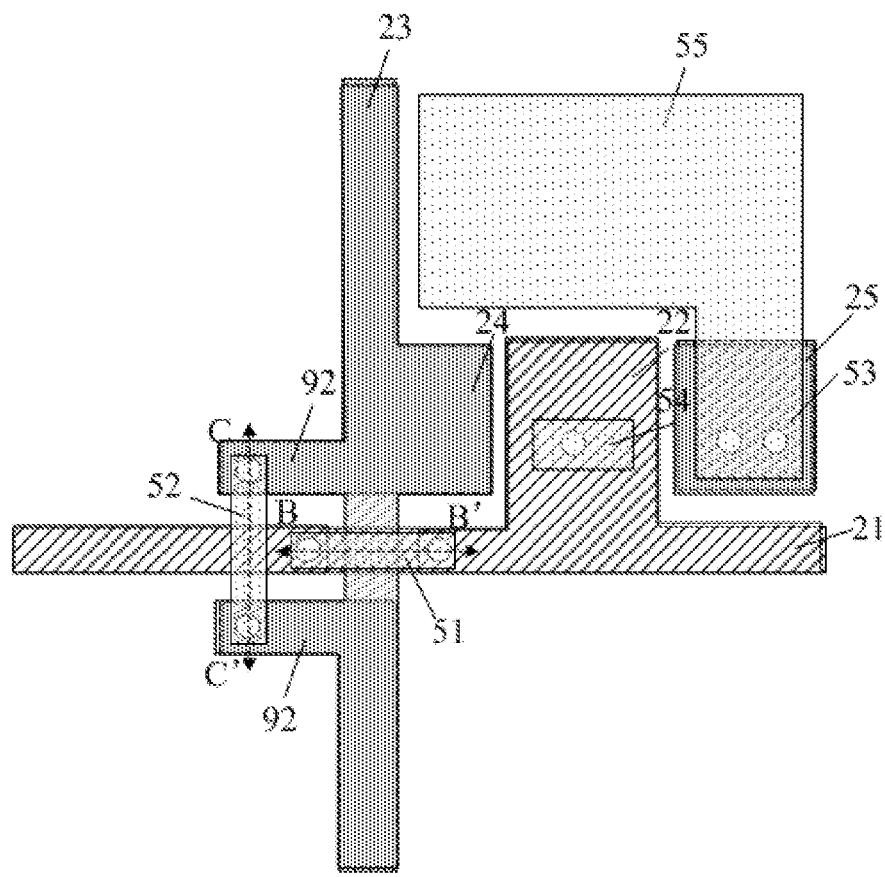
FIG. 17 is a schematic diagram after the layers in FIG. 15 and FIG. 16 are stacked over each other, in a top view.
Figure 18:
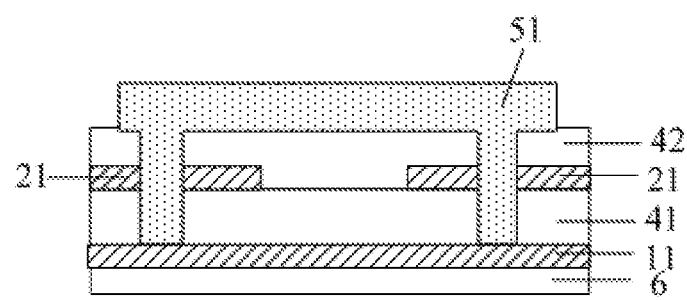
FIG. 18 is a schematic structural diagram of FIG. 17 in a sectional view along B-B'.
Figure 19:
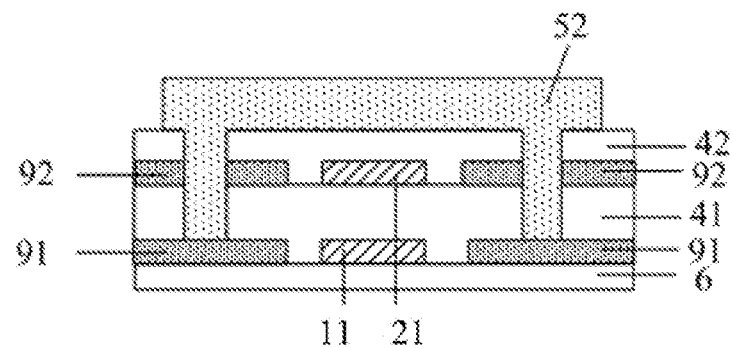
FIG. 19 is a schematic structural diagram of FIG. 17 in a sectional view along C-C'.
Figure 20:
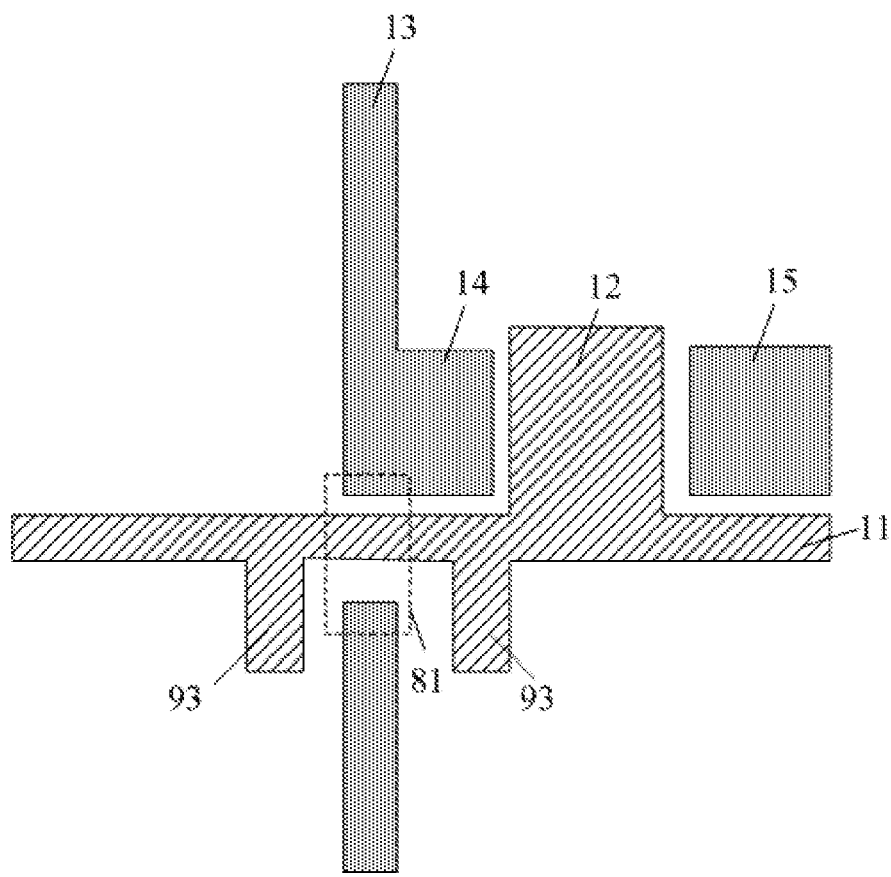
FIG. 20 is a schematic diagram of the embodiments of the disclosure in which a first data line of a first conductive layer is broken, and gate lines are arranged with protrusions, in a top view.

In a further example, as illustrated in FIG. 15 to FIG. 19, FIG. 15 illustrates the first conductive layer, FIG. 16 illustrates the second conductive layer, FIG. 17 illustrates a schematic diagram after they are stacked over each other in a sectional view, FIG. 18 is a schematic structural diagram of FIG. 17 in a sectional view along B-B', and FIG. 19 is a schematic structural diagram of FIG. 17 in a sectional view along C-C', where a first broken zone 81 is arranged on the first data line 13 at the intersection thereof with the first gate line 11, a second broken zone 82 is arranged on the second gate line 21 at the intersection thereof with the second data line 23, and a second insulation layer 42 is arranged on a side of the second conductive layer facing away from the first insulation layer 41.

Where, the first data line 13 is provided with first protrusions 91 at two sides of the first broken zone 81, at a side of the first data line 13 facing away from the first source 14; and the second data line 23 is provided with second protrusions 92 at regions thereof corresponding to the first protrusions 91.

As illustrated in FIG. 17 and FIG. 19, the first data line 13 on both of the two sides of the first broken zone 81 is bridged, through the first protrusions 91, with the second protrusions 92 of the second data line 23 via a second electrode 52 above the second insulation layer 42 through via-holes, in the sectional view along C-C'; and as illustrated in FIG. 17 and FIG. 18, the second gate line 21 on both sides of the second broken zone 82 is bridged with the first gate line 11 via a first electrode 51 above the second insulation layer 42 through via-holes, in the sectional view along B-B'. In a practical implementation, a pixel electrode layer is arranged on a side of the second insulation layer 42 facing away from the second conductive layer, a pixel electrode 55 at the pixel electrode layer is connected with the first drain 15 and the second drain 25 through via-holes, and the first electrode 51 and the second electrode 52 are arranged at the same layer as the pixel electrode 55; and in some embodiments, a fifth electrode 54 can be further arranged at the pixel electrode layer to connect the first gate 12 of the first conductive layer with the second gate 22 of the second conductive layer to thereby reduce a response time of the thin film transistor so as to improve the drive performance thereof.

Figure 21:
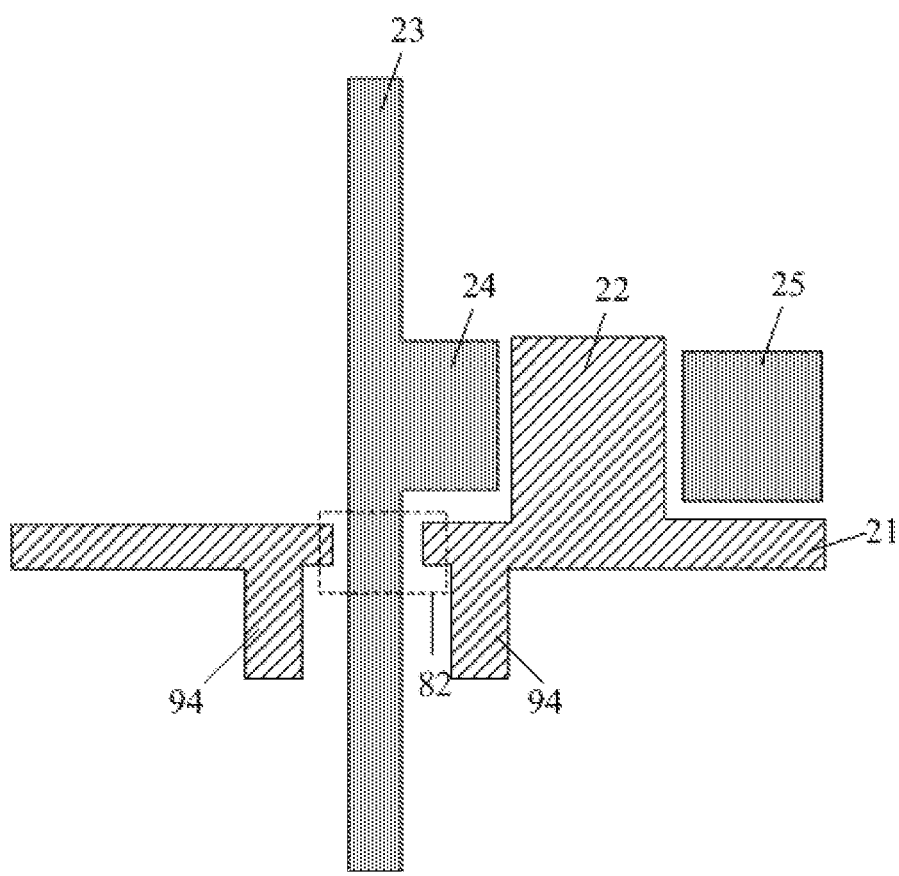
FIG. 21 is a schematic diagram of the embodiments of the disclosure in which a second gate line of a second conductive layer is broken, and gate lines are arranged with protrusions, in a top view.
Figure 22:
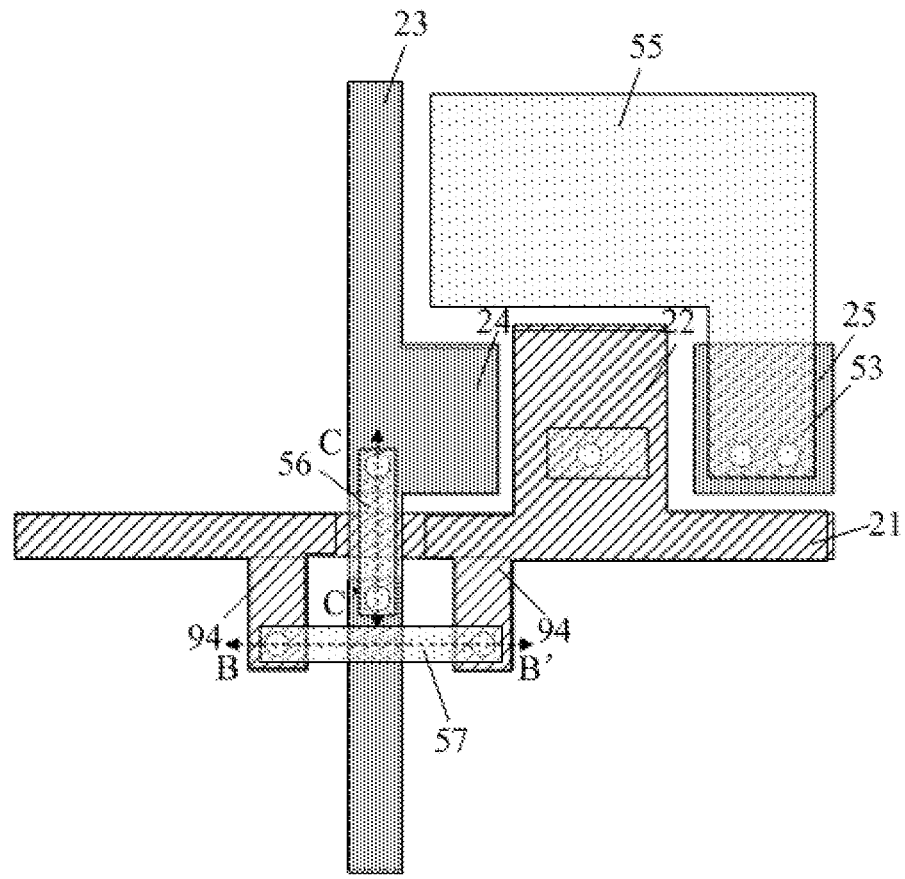
FIG. 22 is a schematic diagram after the layers in FIG. 20 and FIG. 21 are stacked over each other, in a top view.
Figure 23:
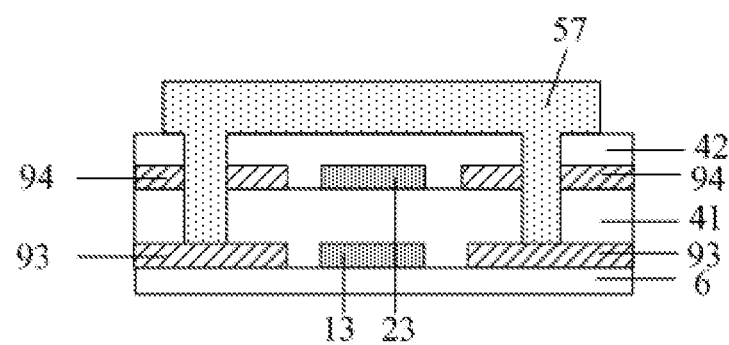
FIG. 23 is a schematic structural diagram of FIG. 22 in a sectional view along B-B'.
Figure 24:
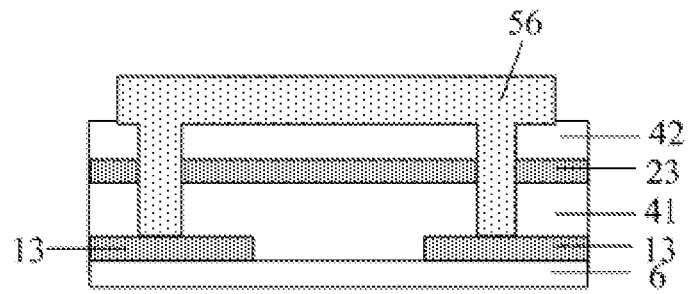
FIG. 24 is a schematic structural diagram of FIG. 22 in a sectional view along C-C'.

In a further example, as illustrated in FIG. 20 to FIG. 24, FIG. 20 illustrates the first conductive layer, FIG. 21 illustrates the second conductive layer, FIG. 22 illustrates a schematic diagram after they are stacked over each other in a sectional view, FIG. 23 is a schematic structural diagram of FIG. 22 in a sectional view along B-B', and FIG. 24 is a schematic structural diagram of FIG. 22 in a sectional view along C-C', where a first broken zone 81 is arranged on the first data line 13 at the intersection thereof with the first gate line 11, a second broken zone 82 is arranged on the second gate line 21 at the intersection thereof with the second data line 23, and a second insulation layer 42 is arranged on a side of the second conductive layer facing away from the first insulation layer 41.

Where, the first gate line 11 is provided with third protrusions 93 at two sides of the first broken zone 81, at a side of the first gate line 11 facing away from the first gate 12; and the second gate line 21 is provided with fourth protrusions 94 at regions thereof corresponding to the third protrusions 93.

Figure 32:
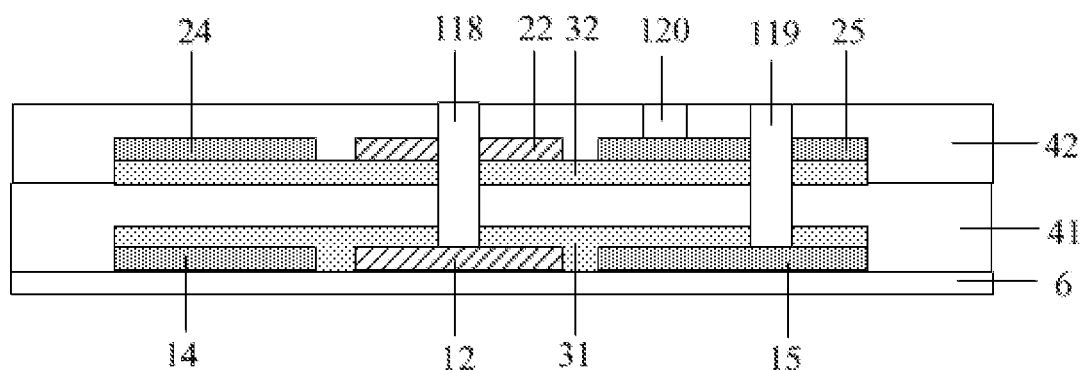
FIG. 32 is a schematic diagram after a second insulation layer is fabricated according to the embodiments of the disclosure in a sectional view along A-A'.

As illustrated in FIG. 22 and FIG. 24, the first data line 13 on both of the two sides of the first broken zone 81 is bridged with the second data line 23 via a fourth electrode 56 above the second insulation layer 42 through via-holes, in the sectional view along C-C'; and as illustrated in FIG. 32 and FIG. 23, the second gate line 21 on both sides of the second broken zone 82 is bridged, through the fourth protrusions 94, with the third protrusions 93 of the first gate line 11 via a third electrode 57 above the second insulation layer 42 through via-holes, in the sectional view along B-B'. In a practical implementation, a pixel electrode layer is arranged on a side of the second insulation layer 42 facing away from the second conductive layer, a pixel electrode 55 at the pixel electrode layer is connected with the first drain 15 and the second drain 25 through via-holes, and the third electrode 57 and the fourth electrode 56 are arranged at the same layer as the pixel electrode 55; and in some embodiments, a fifth electrode 54 can be further arranged at the pixel electrode layer to connect the first gate 12 of the first conductive layer with the second gate 22 of the second conductive layer to thereby reduce a response time of the thin film transistor so as to improve the drive performance thereof.

In some embodiments, a material of the active layer 31 (32) is a metal oxide semiconductor. In the embodiments of the disclosure, when the material of the active layer 31 (32) is a metal oxide semiconductor, the first conductive layer and the second conductive layer are arranged in a stack manner to protect the metal oxide semiconductor therein to thereby avoid threshold voltage from drifting due to excitation of the metal oxide semiconductor by incident light efficiently so as to improve the quality of a displayed image. In some embodiments, the material(s) of the first conductive layer and the second conductive layer can be light-shielding material(s), such as metal.

In some embodiments, the active layer 31 is arranged on the side of the first insulation layer 41 facing the first conductive layer, and the material of the first conductive layer is conductive metal oxide or metal. In the related art, a semiconductor is deposited on an insulation layer with a considerable segment difference between them, thus resulting in a large number of defects at a semiconductor active layer formed thereon, which lowers a mobility of the semiconductor, and a drive performance of a thin film transistor; and in the embodiments of the disclosure, the semiconductor is deposited on a metal layer, thus resulting in a good uniformity and a small number of defects of the semiconductor active layer formed thereon, thereby the mobility of the semiconductor and the drive performance of the thin film transistor are both improved.

In some embodiments, the material of the second conductive layer is the same as the material of the first conductive layer. In some embodiments, both of the materials can be conductive metal oxide (e.g., Indium Tin Oxide (ITO), etc.) or metal (e.g., Mo, Al, Cu, etc.).

Based upon the same inventive idea, the embodiments of the disclosure further provide an array substrate including the thin film transistor according to the embodiments of the disclosure.

Based upon the same inventive idea, the embodiments of the disclosure further provide a display panel including the array substrate according to the embodiments of the disclosure.

Figure 25:
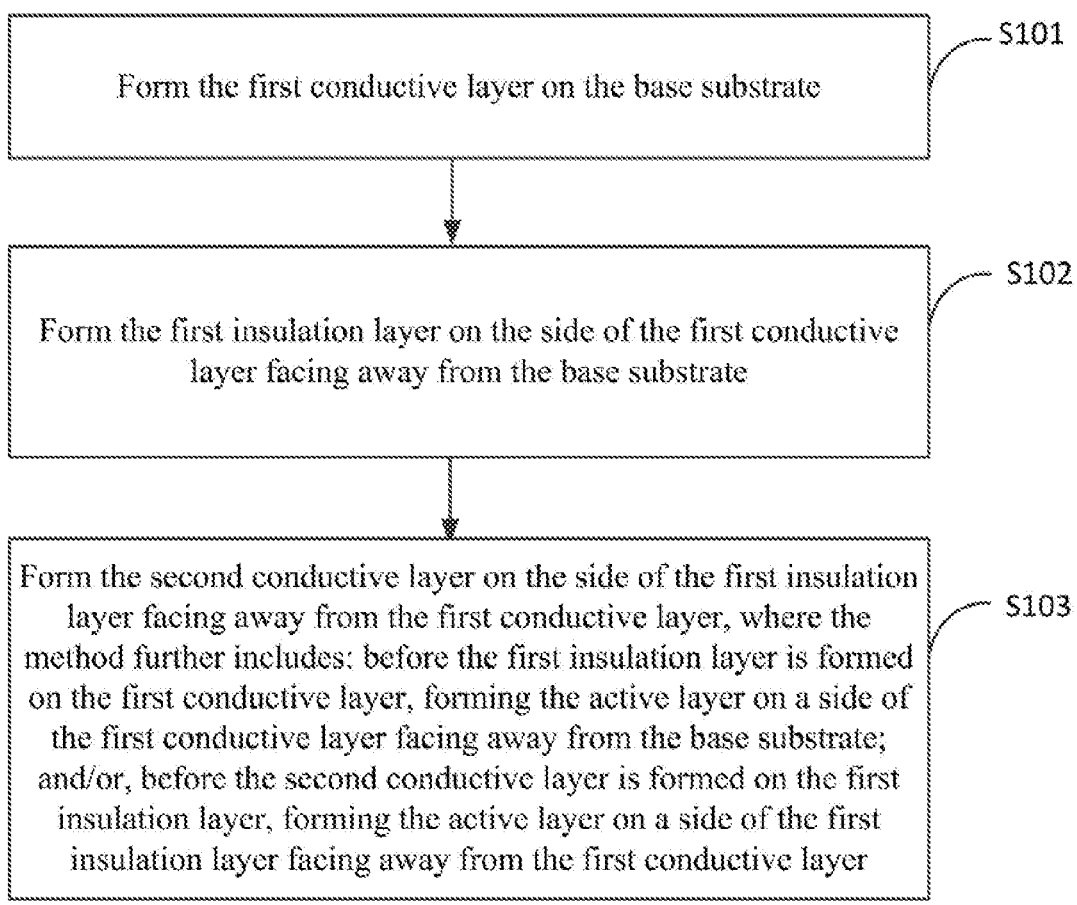
FIG. 25 is a schematic flow chart of fabricating a thin film transistor according to the embodiments of the disclosure.

Based upon the same inventive idea, the embodiments of the disclosure further provide a method for fabricating the thin film transistor according to the embodiments of the disclosure, and as illustrated in FIG. 25, the method includes following operations.

The operation S101 is to form the first conductive layer on the base substrate. In some embodiments, forming the first conductive layer on the base substrate includes: forming the first conductive layer on the base substrate in a mask process.

The operation S102 is to form the first insulation layer on the side of the first conductive layer facing away from the base substrate.

The operation S103 is to form the second conductive layer on the side of the first insulation layer facing away from the first conductive layer. In some embodiments, forming the second conductive layer on the side of the first insulation layer facing away from the first conductive layer includes: forming the second conductive layer on the side of the first insulation layer facing away from the first conductive layer in a mask process; where before the first insulation layer is formed on the side of the first conductive layer facing away from the base substrate, the method further includes: forming the active layer on a side of the first conductive layer facing away from the base substrate; and/or before the second conductive layer is formed on the side of the first insulation layer facing away from the first conductive layer, the method further includes: forming the active layer on a side of the first insulation layer facing away from the first conductive layer.

In some embodiments, the method further includes following operations.

The operation S105 is to form a second insulation layer on a side of the second conductive layer facing away from the first insulation layer.

The operation S106 is to form a pixel electrode layer on a side of the second insulation layer facing away from the second conductive layer.

In order to make the method for fabricating the thin film transistor according to the embodiments of the disclosure more apparent, the method for fabricating the thin film transistor according to the embodiments of the disclosure will be described below in details with reference to FIG. 26 to FIG. 36 by way of an example in which a first broken zone 81 is arranged on the first gate line 11 at an intersection thereof with the first data line 13, a second broken zone 82 is arranged on the second data line 23 at an intersection thereof with the second gate line 21, and a second insulation layer 42 is arranged on a side of the second conductive layer facing away from the first insulation layer 41; and the first data line 13 is provided with first protrusions 91 at two sides of the first broken zone 81, at a side of the first data line 13 facing away from the first source 14; and the second data line 23 is provided with second protrusions 92 at regions thereof corresponding to the first protrusions 91.

Figure 26:
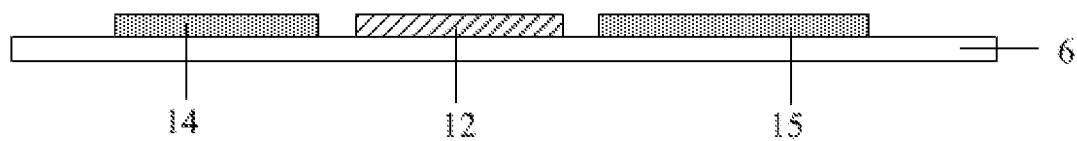
FIG. 26 is a schematic diagram of fabricating a first conductive layer according to the embodiments of the disclosure in a section view.
Figure 27:
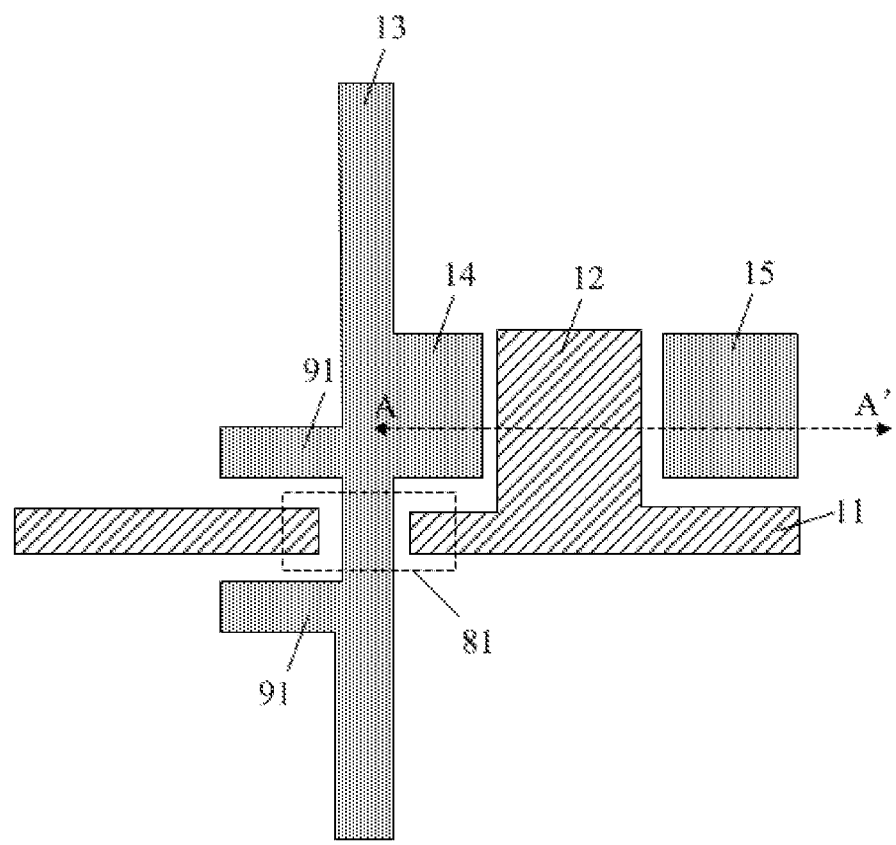
FIG. 27 is a schematic diagram of fabricating the first conductive layer according to the embodiments of the disclosure in a top view.

The first operation is to form a first gate line 11, a first gate 12, a first data line 13, a first source 14, a first drain 15, and the first protrusions 91 connected with the first data line 13 on the base substrate 6 in a mask process as illustrated in FIG. 26 and FIG. 27, where FIG. 26 is a schematic diagram of FIG. 27 in a sectional view along A-A'. In some embodiments, the base substrate 6 can be a transparent glass substrate, and all of the first gate line 11, the first gate 12, the first data line 13, the first source 14, the first drain 15, and the first protrusions 91 can be conductive metal oxide (e.g., Indium Tin Oxide (ITO)) layers or metal (e.g., Mo, Al, Cu) layers for high uniformity to thereby reduce the number of defects in the metal oxide semiconductor.

Figure 28:
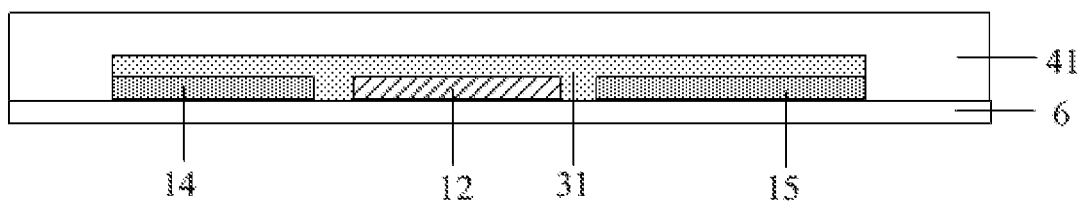
FIG. 28 is a schematic diagram of fabricating a first active layer and a first insulation layer according to the embodiments of the disclosure in a section view.

The second operation is to form a first active layer 31 and the first insulation layer 41 on the base substrate 6 in a mask process as illustrated in FIG. 28. Where, the material of the first active layer 31 can be a metal oxide semiconductor, for example, a binary oxide semiconductor such as ZnO, $In_2O_3$, $SnO_2$, $Ga_2O_3$, etc., a ternary oxide semiconductor such as InZnO, ZnSnO, NdInO, etc., a quaternary oxide semiconductor such as IGZO, etc; and the material of the first insulation layer 41 can be a layer of SiNx, SiNOX, etc.

Figure 29:
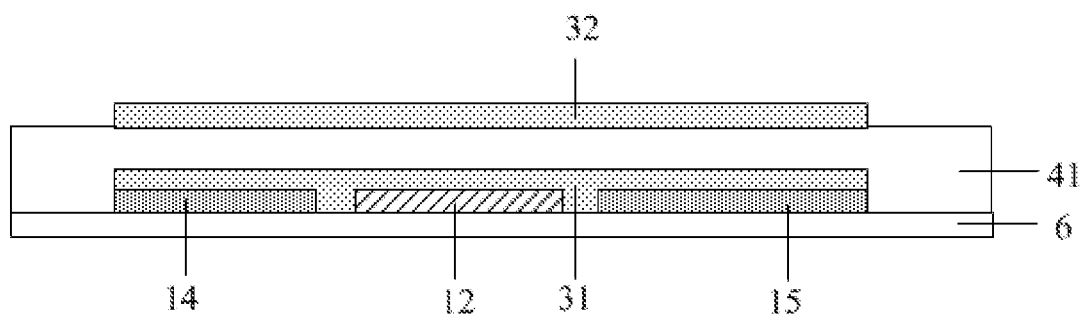
FIG. 29 is a schematic diagram of fabricating a second active layer according to the embodiments of the disclosure in a section view.

The third operation is to form a second active layer 32 on the base substrate 6 in a mask process as illustrated in FIG. 29. Where the material of the second active layer 32 can be the same as the material of the first active layer 31; and the second active layer 32 is located above, and separated by the first insulation layer 41 from, the first active layer 31.

Figure 30:
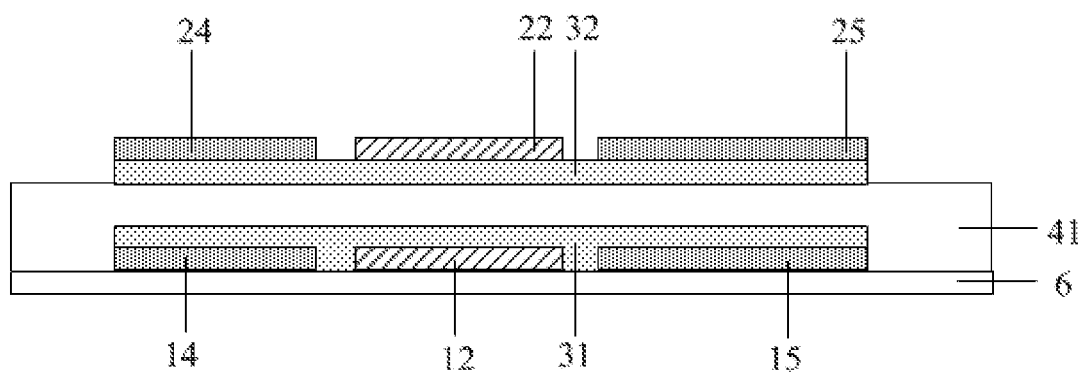
FIG. 30 is a schematic diagram of fabricating a second conductive layer according to the embodiments of the disclosure in a section view.
Figure 31:
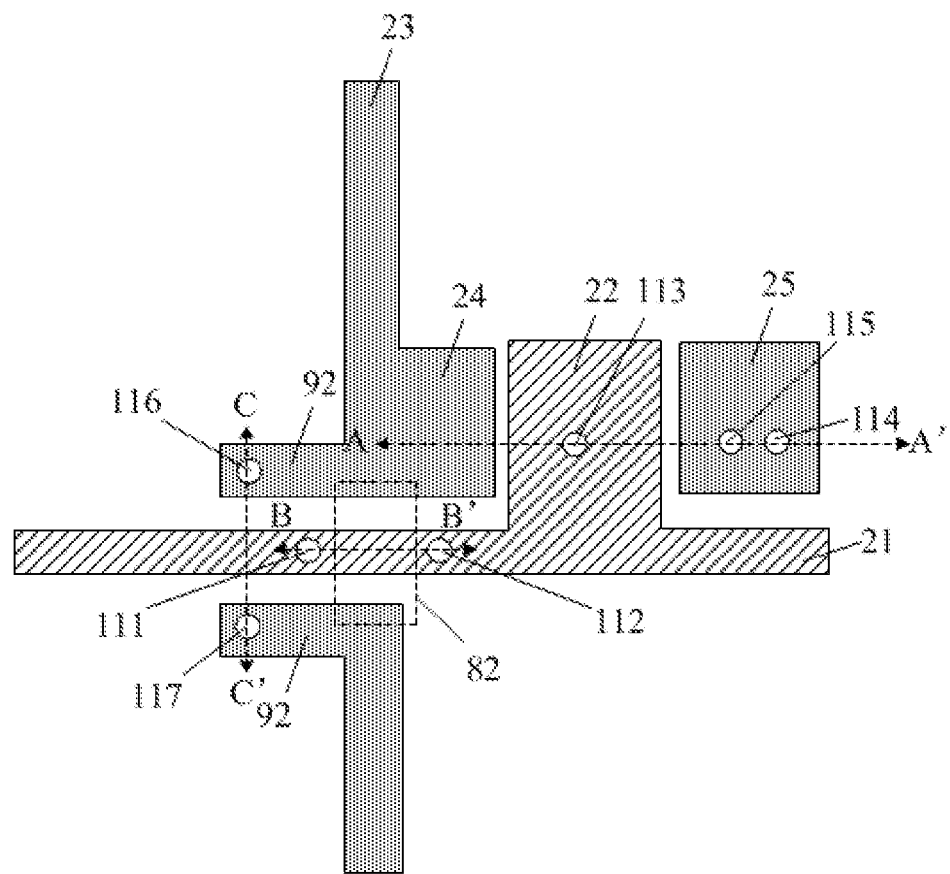
FIG. 31 is a schematic diagram of fabricating the second conductive layer according to the embodiments of the disclosure in a top view.

The fourth operation is to form a second gate line 21, a second gate 22, a second data line 23, a second source 24, a second drain 25, and the second protrusions 92 on the base substrate 6 in a mask process as illustrated in FIG. 30 and FIG. 31. And a first via-hole 111 and a second via-hole 112 are reserved for the second gate line 21 and the second gate 22 on two sides of the second broken zone 82 in the mask process, and a third via-hole 113 is reserved for the second gate 22 above the first gate 12, as illustrated in FIG. 31, where these via-holes are via-holes reserved for the dual gates to be connected. A sixth via-hole 116 and a seventh via-hole 117 are reserved for the second data line 23 in the mask process, and a fourth via-hole 114 and a fifth via-hole 115 are reserved for the second drain 25, where these via-holes are via-holes reserved for the dual sources-drains to be connected. Here orthographic projections of the second gate line 21, the second gate 22, the second data line 23, the second source 24, and the second drain 26 other than the second broken zone 82 onto the base substrate overlap respectively with orthographic projections of the first gate line 11, the first gate 12, the first data line 13, the first source 14, and the first source 15 other than the first broken zone 81 onto the base substrate 6.

Figure 33:
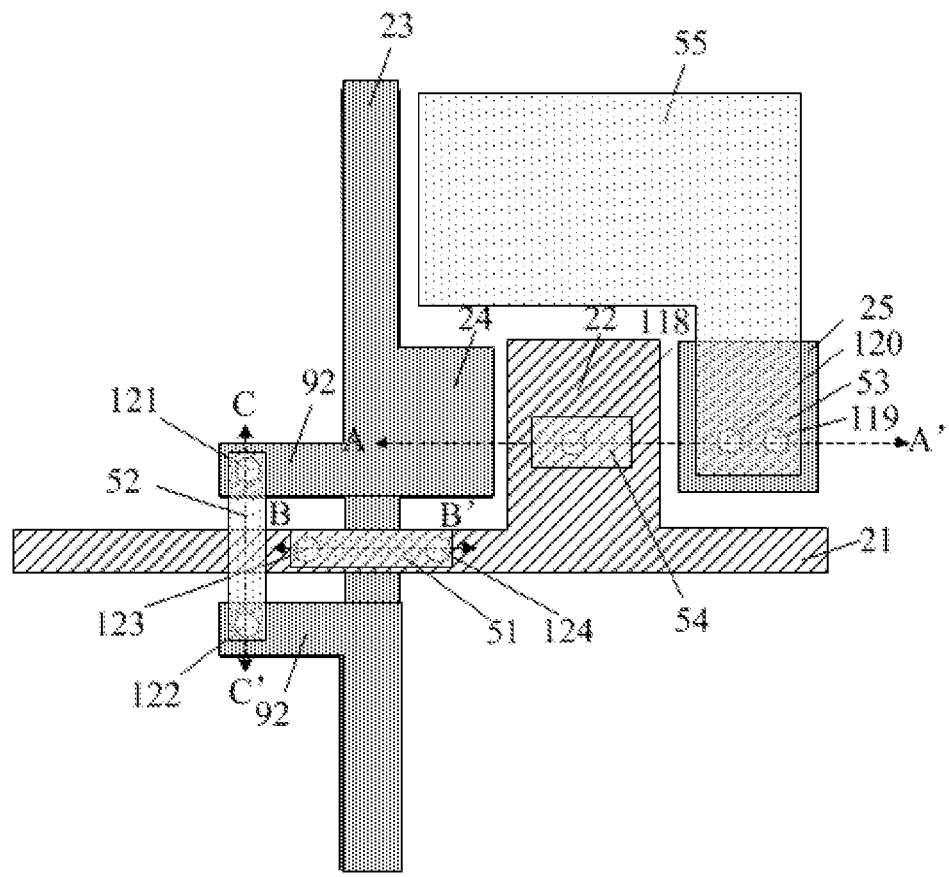
FIG. 33 is a schematic diagram after a pixel electrode layer is fabricated according to the embodiments of the disclosure in a top view.
Figure 34:
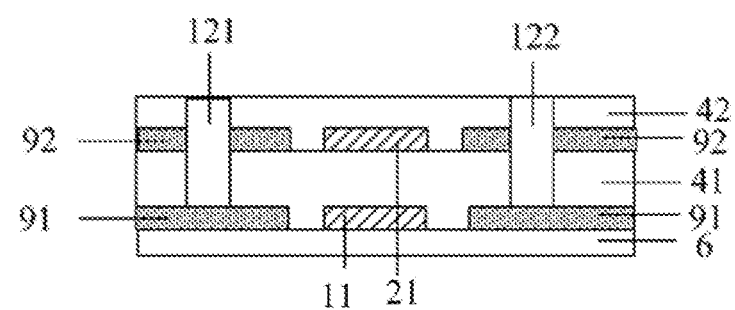
FIG. 34 is a schematic diagram after the second insulation layer is fabricated according to the embodiments of the disclosure in a sectional view along C-C'.
Figure 35:
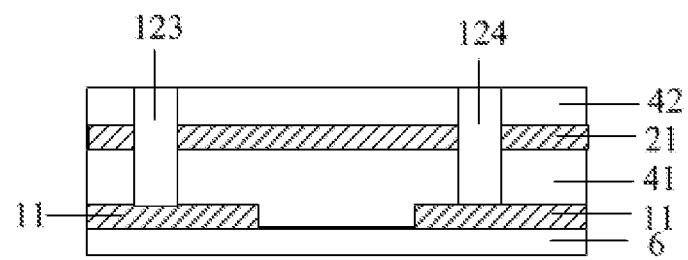
FIG. 35 is a schematic diagram after the second insulation layer is fabricated according to the embodiments of the disclosure in a sectional view along B-B'.

The fifth operation is to form a second gate insulation layer 42 on the base substrate 6 in a mask process as illustrated in FIG. 32 and FIG. 33, where FIG. 33 is a schematic structural diagram after the pixel electrode layer is formed, and only illustrates the via-holes at the insulation layer, but does not illustrates the insulation layer, and FIG. 32 is a schematic diagram of FIG. 33 in a sectional view along A-A'. As illustrated in FIG. 31 to FIG. 33, an eighth via-hole 118 (connecting to the first gate 12 through the third via-hole 113 of the second gate 22) is formed at a region of the insulation layer in correspondence to the third via-hole 113, a ninth via-hole 119 (connecting to the first drain 15 through the fourth via-hole 114 of the second drain 24) is formed at a region of the insulation layer in correspondence to the fourth via-hole, and a tenth via-hole 120 (connecting to the second drain 25) is formed at a region of the insulation layer in correspondence to the fifth via-hole. As illustrated in FIG. 31, FIG. 33, and FIG. 34, an eleventh via-hole 121 (connecting to a first protrusion 91 of the first source 14 through the sixth via-hole 116 of the second source) is formed at a region of the insulation layer in correspondence to the sixth via-hole 116, and a twelfth via-hole 122 (connecting to a first protrusion 91 of the first source 14 through the seventh via-hole 117 of the second source) is formed at a region of the insulation layer in correspondence to the seventh via-hole 117 in the sectional view along C-C'. As illustrated in FIG. 31, FIG. 33, and FIG. 35, a thirteenth via-hole 123 (connecting to the first gate line 11 through the first via-hole 111 of the second gate line 21) is formed at a region of the insulation layer in correspondence to the first via-hole 111, and a fourteenth via-hole 124 (connecting to the first gate line 11 through the second via-hole 112 of the second gate line 21) is formed at a region of the insulation layer in correspondence to the second via-hole 112 in the sectional view along B-B'.

Figure 36:
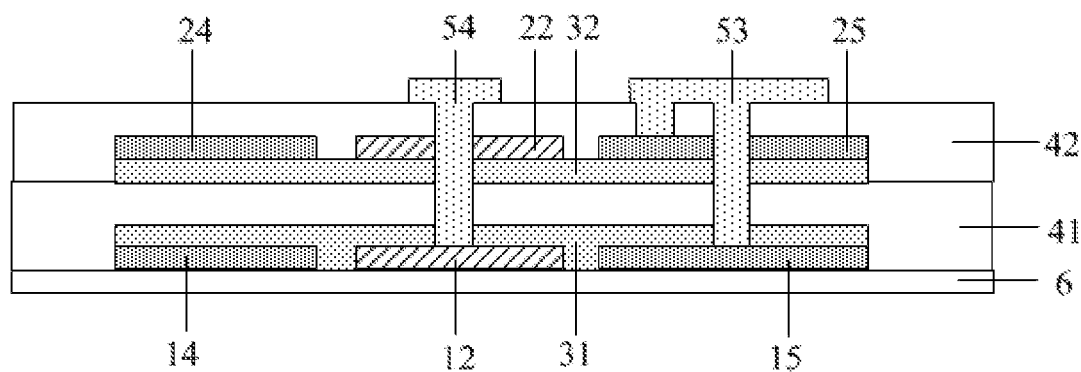
FIG. 36 is a schematic diagram after a pixel electrode layer is fabricated according to the embodiments of the disclosure in a sectional view along A-A' in FIG. 33.

The sixth operation is to form a pixel electrode 55 on the base substrate 6 in a mask process as illustrated in FIG. 33 and FIG. 36, where the pixel electrode 55 is a transparent conductive layer (e.g., ITO). The first gate line 11 and the second gate line 21 are connected using the first electrode 51 through the thirteenth via-hole 123 and the fourteenth via-hole 124; the first data line 13 and the second data line 23 are connected using the second electrode 52 through the eleventh via-hole 121 and the twelfth via-hole 122; the upper and lower first gate 12 and second gate 22 in the TFT area are connected using the fifth electrode 54 through the eighth via-hole 118; and the first drain 15 and the second drain 25 are connected using a part of a sixth electrode 53 of the pixel electrode 55 through the ninth via-hole 119, where the sixth electrode 53 is connected with the pixel electrode 55 in the pixel area, the second drain 25 is connected with the pixel electrode 55 through the tenth via-hole 120, and the pixel electrode 55 covers both the ninth via-hole 119 and the tenth via-hole 120 to thereby improve a lapping ability through the via-holes; further, the tenth via-hole 120 may or may be dispensed with as needed for an area occupied by the via-holes.

Advantageous effects of the embodiments of the disclosure are as follows: a thin film transistor according to the embodiments of the disclosure includes a first conductive layer on a base substrate, a first insulation layer on a side of the first conductive layer facing away from the base substrate, and a second conductive layer on a side of the first insulation layer facing away from the first conductive layer, where an active layer is arranged on a side of the first insulation layer facing the first conductive layer, and/or a side of the first insulation layer facing the second conductive layer; and the first conductive layer includes a first gate line extending in a first direction, a first gate connected with the first gate line, a first data line extending in a second direction, a first source connected with the first data line, and a first drain, where the second direction is perpendicular to the first direction, and the first data line or the first gate line is arranged with a first broken zone at their intersection; the second conductive layer includes a second gate line extending in the first direction, a second gate connected with the second gate line, a second data line extending in the second direction, a second source connected with the second data line, and a second drain, where a second broken zone is arranged on the second data line or on the second gate line at their intersection. That is, in the thin film transistor according to the embodiments of the disclosure, the gate, and the source and drain are arranged at the same layer to thereby effectively improve the uniformity of an array substrate including the thin film transistor, reduce the segment difference, and avoid a spot from arising from rubbing in a cell assembly process, and as compared with the related art in which the gate, and the source and drain are wired at single layers respectively, the gate and the source and drain are wired at the same layer to thereby reserve a larger area and further save a cost without affecting a cover area thereof.

Further, in the thin film transistor according to the embodiments of the disclosure, orthographic projections of the second gate line, the second gate, the second data line, the second source, and the second drain of the second conductive layer onto the base substrate overlap respectively with orthographic projections of the first gate line, the first gate, the first data line, the first source, and the first drain of the first conductive layer onto the base substrate; and the first gate line is connected with the second gate line, the first data line is connected with the second data line, and the first drain is connected with the second drain, through via-holes. That is, when each of the gate, the source and drain, and the active layer is arranged in two layers, the two layers of the active layer are connected, and the two layers of the gate are connected, through via-holes, so the thickness of the active layer, and the thickness of the gate are substantially increased, and the two-layer gate can drive the two-layer active layer concurrently, thus resulting in a thin film transistor in a dual-drive structure to thereby improve the drive capacity of the thin film transistor, reduce a response time, lower drive voltage, and save power consumption; and further, the different layers of the gate, and the source and drain are connected through via-holes to thereby shorten a Resistance-Capacitance (RC) delay so as to effectively lower power consumption, and even if some layer of the gate or the source and drain is short-circuited, or there is a bad lapping through some via-hole, then the circuit will not be broken, thus improving the product yield. Additionally, in the thin film transistor according to the embodiments of the disclosure, the two layers of the gate are arranged in a stack manner, which can effectively integrate both the advantages of a top-gate structure and a bottom-gate structure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A thin film transistor, comprising: a first conductive layer on a base substrate; a first insulation layer on a side of the first conductive layer facing away from the base substrate; a second conductive layer on a side of the first insulation layer facing away from the first conductive layer; and an active layer arranged on a side of the first insulation layer facing the first conductive layer, and/or a side of the first insulation layer facing the second conductive layer; wherein the first conductive layer comprises: a first gate line extending in a first direction, a first gate connected with the first gate line, a first data line extending in a second direction, a first source connected with the first data line, and a first drain; wherein the second direction is perpendicular to the first direction, and the first data line or the first gate line is arranged with a first broken zone at their intersection; the second conductive layer comprises: a second gate line extending in the first direction, a second gate connected with the second gate line, a second data line extending in the second direction, a second source connected with the second data line, and a second drain; wherein the second data line or the second gate line is arranged with a second broken zone at their intersection, wherein orthographic projections of the second gate line, the second gate, the second data line, the second source, and the second drain of the second conductive layer onto the base substrate overlap respectively with orthographic projections of the first gate line, the first gate, the first data line, the first source, and the first drain of the first conductive layer onto the base substrate; and the first gate line is connected with the second gate line, the first data line is connected with the second data line, and the first drain is connected with the second drain, through via-holes.

2. The thin film transistor according to claim 1, wherein a second insulation layer is arranged on a side of the second conductive layer facing away from the first insulation layer; and when the first gate line is arranged with the first broken zone, and the second data line is arranged with the second broken zone, a side of the first data line facing away from the first source is provided with first protrusions at two sides of the first broken zone, and the second data line is provided with second protrusions at regions thereof corresponding to the first protrusions; and the first gate line on the two sides of the first broken zone is bridged with the second gate line via a first electrode above the second insulation layer through via-holes, and the second data line on two sides of the second broken zone is bridged with the first protrusions of the first data line through the second protrusions, wherein the second protrusions are bridged with the first protrusions via a second electrode above the second insulation layer through via-holes.

3. The thin film transistor according to claim 1, wherein a second insulation layer is arranged on a side of the second conductive layer facing away from the first insulation layer; and when the first gate line is arranged with the first broken zone, and the second data line is arranged with the second broken zone, a side of the first gate line facing away from the first gate is provided with third protrusions at two sides of the first broken zone, and the second gate line is provided with fourth protrusions at regions thereof corresponding to the third protrusions; and the first gate line on the two sides of the first broken zone is bridged with the fourth protrusions of the second gate line through the third protrusions, wherein the third protrusions are bridged with the fourth protrusions via a third electrode above the second insulation layer through via-holes; and the second data line on two sides of the second broken zone is bridged with the first data line via a fourth electrode above the second insulation layer through via-holes.

4. The thin film transistor according to claim 1, wherein a second insulation layer is arranged on a side of the second conductive layer facing away from the first insulation layer; and when the first data line is arranged with the first broken zone, and the second gate line is arranged with the second broken zone, a side of the first data line facing away from the first source is provided with first protrusions at two sides of the first broken zone, and the second data line is provided with second protrusions at regions thereof corresponding to the first protrusions; and the first gate line on the two sides of the first broken zone is bridged with the second protrusions of the second data line through the first protrusions, wherein the first protrusions are bridged with the second protrusions via a second electrode above the second insulation layer through via-holes; and the second gate line on two sides of the second broken zone is bridged with the first gate line via a first electrode above the second insulation layer through via-holes.

5. The thin film transistor according to claim 1, wherein a second insulation layer is arranged on a side of the second conductive layer facing away from the first insulation layer; and when the first data line is arranged with the first broken zone, and the second gate line is arranged with the second broken zone, a side of the first gate line facing away from the first gate is provided with third protrusions at two sides of the first broken zone, and the second gate line is provided with fourth protrusions at regions thereof corresponding to the third protrusions; and the first data line on the two sides of the first broken zone is bridged with the second data line via a fourth electrode above the second insulation layer through via-holes; and the second gate line on two sides of the second broken zone is bridged with the third protrusions of the first gate line through the fourth protrusions, wherein the fourth protrusions are bridged with the third protrusions via a third electrode above the second insulation layer through via-holes.

6. The thin film transistor according to claim 2, wherein a pixel electrode is arranged on a side of the second insulation layer facing away from the second conductive layer, and the first electrode and the second electrode are arranged at a same layer as the pixel electrode.

7. The thin film transistor according to claim 4, wherein a pixel electrode is arranged on a side of the second insulation layer facing away from the second conductive layer, and the first electrode and the second electrode are arranged at a same layer as the pixel electrode.

8. The thin film transistor according to claim 3, wherein a pixel electrode is arranged on a side of the second insulation layer facing away from the second conductive layer, and the third electrode and the fourth electrode are arranged at a same layer as the pixel electrode.

9. The thin film transistor according to claim 5, wherein a pixel electrode is arranged on a side of the second insulation layer facing away from the second conductive layer, and the third electrode and the fourth electrode are arranged at a same layer as the pixel electrode.

10. The thin film transistor according to claim 1, wherein the first gate is connected with the second gate through a via-hole, and the first source is connected with the second source through a via-hole.

11. The thin film transistor according to claim 1, wherein a material of the active layer is a metal oxide semiconductor.

12. The thin film transistor according to claim 11, wherein the active layer is arranged on the side of the first insulation layer facing the first conductive layer, and a material of the first conductive layer is a conductive metal oxide or a metal.

13. The thin film transistor according to claim 1, wherein a material of the second conductive layer is same as a material of the first conductive layer.

14. An array substrate, comprising a thin film transistor, wherein thin film transistor comprises: a first conductive layer on a base substrate; a first insulation layer on a side of the first conductive layer facing away from the base substrate; a second conductive layer on a side of the first insulation layer facing away from the first conductive layer; and an active layer arranged on a side of the first insulation layer facing the first conductive layer, and/or a side of the first insulation layer facing the second conductive layer; wherein the first conductive layer comprises: a first gate line extending in a first direction, a first gate connected with the first gate line, a first data line extending in a second direction, a first source connected with the first data line, and a first drain; wherein the second direction is perpendicular to the first direction, and the first data line or the first gate line is arranged with a first broken zone at their intersection; the second conductive layer comprises: a second gate line extending in the first direction, a second gate connected with the second gate line, a second data line extending in the second direction, a second source connected with the second data line, and a second drain; wherein the second data line or the second gate line is arranged with a second broken zone at their intersection, wherein orthographic projections of the second gate line, the second gate, the second data line, the second source, and the second drain of the second conductive layer onto the base substrate overlap respectively with orthographic projections of the first gate line, the first gate, the first data line, the first source, and the first drain of the first conductive layer onto the base substrate; and the first gate line is connected with the second gate line, the first data line is connected with the second data line, and the first drain is connected with the second drain, through via-holes.

15. The array substrate according to claim 14, wherein a second insulation layer is arranged on a side of the second conductive layer facing away from the first insulation layer; and when the first gate line is arranged with the first broken zone, and the second data line is arranged with the second broken zone, a side of the first data line facing away from the first source is provided with first protrusions at two sides of the first broken zone, and the second data line is provided with second protrusions at regions thereof corresponding to the first protrusions, and the first gate line on the two sides of the first broken zone is bridged with the second gate line via a first electrode above the second insulation layer through via-holes, and the second data line on two sides of the second broken zone is bridged with the first protrusions of the first data line through the second protrusions, wherein the second protrusions are bridged with the first protrusions via a second electrode above the second insulation layer through via-holes; or, a side of the first gate line facing away from the first gate is provided with third protrusions at two sides of the first broken zone, and the second gate line is provided with fourth protrusions at regions thereof corresponding to the third protrusions, and the first gate line on the two sides of the first broken zone is bridged with the fourth protrusions of the second gate line through the third protrusions, wherein the third protrusions are bridged with the fourth protrusions via a third electrode above the second insulation layer through via-holes, and the second data line on two sides of the second broken zone is bridged with the first data line via a fourth electrode above the second insulation layer through via-holes; or, when the first data line is arranged with the first broken zone, and the second gate line is arranged with the second broken zone, a side of the first data line facing away from the first source is provided with first protrusions at two sides of the first broken zone, and the second data line is provided with second protrusions at regions thereof corresponding to the first protrusions, and the first gate line on the two sides of the first broken zone is bridged with the second protrusions of the second data line through the first protrusions, wherein the first protrusions are bridged with the second protrusions via a second electrode above the second insulation layer through via-holes, and the second gate line on two sides of the second broken zone is bridged with the first gate line via a first electrode above the second insulation layer through via-holes; or, a side of the first gate line facing away from the first gate is provided with third protrusions at two sides of the first broken zone, and the second gate line is provided with fourth protrusions at regions thereof corresponding to the third protrusion, and the first data line on the two sides of the first broken zone is bridged with the second data line via a fourth electrode above the second insulation layer through via-holes; and the second gate line on two sides of the second broken zone is bridged with the third protrusions of the first gate line through the fourth protrusions, wherein the fourth protrusions are bridged with the third protrusions via a third electrode above the second insulation layer through via-holes.

16. A display panel, comprising the array substrate according to claim 14.

17. A method for fabricating the thin film transistor according to claim 1, the method comprising:
   forming the first conductive layer on the base substrate;
   forming the first insulation layer on the side of the first conductive layer facing away from the base substrate; and
   forming the second conductive layer on the side of the first insulation layer facing away from the first conductive layer;
   wherein the method further comprises: before the first insulation layer is formed on the side of the first conductive layer facing away from the base substrate, forming the active layer on a side of the first conductive layer facing away from the base substrate; and/or,
   before the second conductive layer is formed on the side of the first insulation layer facing away from the first conductive layer, forming the active layer on a side of the first insulation layer facing away from the first conductive layer.

18. The method according to claim 17, wherein the method further comprises:

forming a second insulation layer on a side of the second conductive layer facing away from the first insulation layer; and forming a pixel electrode layer on a side of the second insulation layer facing away from the second conductive layer.

* * * * *